(12) United States Patent
Raaijmakers et al.

(10) Patent No.: US 6,759,325 B2
(45) Date of Patent: Jul. 6, 2004

(54) SEALING POROUS STRUCTURES

(75) Inventors: Ivo Raaijmakers, Bilthoven (NL);
Pekka T. Soininen, Helsinki (FI);
Ernst Granneman, Hilversum (NL);
Suvi Haukka, Helsinki (FI); Kai-Erik Elers, Portland, OR (US); Marko Tuominen, Helsinki (FI); Hessel Sprey, Kessel-Lo (BE); Herbert Terhorst, Amersfoort (NL); Menso Hendriks, Soest (NL)

(73) Assignee: ASM Microchemistry Oy (FI)

( * ) Notice: Subject to any disclaimer, the term of this patent is extended or adjusted under 35 U.S.C. 154(b) by 0 days.

(21) Appl. No.: 10/303,293

(22) Filed: Nov. 22, 2002

(65) Prior Publication Data

US 2003/0143839 A1 Jul. 31, 2003

Related U.S. Application Data

(60) Continuation-in-part of application No. 10/237,526, filed on Sep. 6, 2002, which is a division of application No. 09/843,518, filed on Apr. 26, 2001, now Pat. No. 6,482,733.
(60) Provisional application No. 60/235,772, filed on Sep. 26, 2000, and provisional application No. 60/204,231, filed on May 15, 2000.

(51) Int. Cl.$^7$ .......................................... H01L 21/4763
(52) U.S. Cl. ...................................... 438/633; 438/640
(58) Field of Search ............................... 438/625, 627, 438/633, 634, 637, 640, 643, 681, 725

(56) References Cited

U.S. PATENT DOCUMENTS 4,058,430 A  11/1977  Suntola et al. .............. 156/611

(List continued on next page.)

FOREIGN PATENT DOCUMENTS

| DE | 196 27 017 A1 | 1/1997 |
|---|---|---|
| DE | 198 20 147 A1 | 7/1999 |
| WO | WO 96/17107 | 6/1996 |
| WO | WO 99/41423 A3 | 8/1999 |
| WO | WO 99/41423 A2 | 8/1999 |

OTHER PUBLICATIONS

"Nanoglass™ Product Bulletin," *Discovery, Allied Signal Advanced Microelectronic Materials.*
Abeles, B. et al., "Amorphous Semiconductor Superlattices," *Physical Review Letters*, Nov. 21, 1983, vol. 51, No. 21, pp. 2003–2006.

(List continued on next page.)

*Primary Examiner*—Puch T. Dang
(74) *Attorney, Agent, or Firm*—Knobbe, Martens, Olson & Bear, LLP

(57) ABSTRACT

Method and structures are provided for conformal lining of dual damascene structures in integrated circuits, and particularly of openings formed in porous materials. Trenches and contact vias are formed in insulating layers. The pores on the sidewalls of the trenches and vias are blocked, and then the structure is exposed to alternating chemistries to form monolayers of a desired lining material. In exemplary process flows chemical or physical vapor deposition (CVD or PVD) of a sealing layer blocks the pores due to imperfect conformality. An alternating process can also be arranged by selection of pulse separation and/or pulse duration to achieve reduced conformality relative to a self-saturating, self-limiting atomic layer deposition (ALD) process. In still another arrangement, layers with anisotropic pore structures can be sealed by selectively melting upper surfaces. Blocking is followed by a self-limiting, self-saturating atomic layer deposition (ALD) reactions without significantly filling the pores.

29 Claims, 21 Drawing Sheets

U.S. PATENT DOCUMENTS

| | | | |
|---|---|---|---|
| 4,413,022 A | 11/1983 | Suntola et al. | 427/255.2 |
| 4,747,367 A | 5/1988 | Posa | 118/715 |
| 4,761,269 A | 8/1988 | Conger et al. | 422/245 |
| 5,071,670 A | 12/1991 | Kelly | 427/38 |
| 5,306,666 A | 4/1994 | Izumi | 437/192 |
| 5,711,811 A | 1/1998 | Suntola et al. | 118/711 |
| 5,769,950 A | 6/1998 | Takasu et al. | 118/715 |
| 5,831,335 A | 11/1998 | Miyamoto | |
| 5,879,459 A | 3/1999 | Gadgil et al. | 118/715 |
| 5,904,565 A | 5/1999 | Nguyen et al. | 438/687 |
| 5,916,365 A | 6/1999 | Sherman | 117/92 |
| 6,077,775 A | 6/2000 | Stumborg et al. | 438/643 |
| 6,083,818 A | 7/2000 | Stumborg et al. | 438/603 |
| 6,207,487 B1 | 3/2001 | Kim et al. | |
| 6,270,572 B1 | 8/2001 | Kim et al. | |
| 6,291,876 B1 | 9/2001 | Stumborg et al. | |
| 6,340,619 B1 | 1/2002 | Ko | |
| 6,351,039 B1 * | 2/2002 | Jin et al. | |
| 6,358,829 B2 * | 3/2002 | Yoon et al. | |
| 6,380,065 B1 | 4/2002 | Komai et al. | |
| 6,391,785 B1 | 5/2002 | Satta et al. | |
| 6,444,495 B1 | 9/2002 | Leung et al. | |

OTHER PUBLICATIONS

Colorado University at Boulder, Feb. 16, 2000, "Ceramic Coatings on Metals Using Atomic Layer Controlled Chemical Vapor Deposition," (Assert–96), U.S. Department of Commerce National Technical Information Service.

Fazan, P.C. et al., "A High–C Capacitor (20.4 Ff/$\mu$m$^2$) with Ultrathin CVD—$Ta_2O_5$ Films Deposited on Rugged Poly–Si for High Density DRAMs," IEEE, 1992, pp. IDEM 92–263–IDEM 92–266.

Haukka, S. et al., "Chemisorption of chromium acetylacetonate on porous high surface area silica," Applied Surface Science, vol. 75, pp. 220–227 (1994).

Hiltunen, L. et al., "Nitrides of Titanium, Molybdenum Grown as Thin Films by the Atomic Layer Epitaxy Method," Thin Solid Films, 1988, vol. 166, pp. 149–154.

Honeywell, "Water Fabrication Materials (WFM) Interconnect Dielectrics," Nanoglass™, World Wide Web address: electronicmaterials.com.

Honeywell, "Wafer Fabrication Materials (WFM) Interconnect Dielectrics," World Wide Web address: electronicmaterials.com.

Horiike, Y. et al., "Filling of Si oxide into a deep trench using digital CVD method," Applied Surface Science, 1990, vol. 46, pp. 168–174.

Jin, Changming et al., "Porous Silica Xerogel Processing and Integration for ULSI Applications," Materials Research Society Symposium Proceedings, vol. 511, pp. 213–222.

Kaizuka, T. et al., "Conformal Chemical Vapor Deposition TiN(111) Film Formation as an Underlayer of Al for Highly Reliable Interconnects," Jpn. J. Appl. Phys., 1994, vol. 33, pp. 470–474.

Kikkawa, T. et al., "A Quarter–Micrometer Interconnection Technology Using a TiN/Al–Si–Cu/TiN/Al–Si–Cu/TiN/Ti Multilayer Structure," IEEE Transactions on Electron Devices, Feb. 1993, vol. 40, No. 2, pp. 296–302.

Kikkawa, T. et al., "Al–Si–Cu/TiN multilayer interconnection and Al–Ge reflow sputtering technologies for quarter–micron devices," SPIE, 1992, vol. 1805, pp. 56–64.

Klaus, J.W. et al., "Atomic Layer Deposition of $SiO_2$ Using Catalyzed and Uncatalyzed Self–Limiting Surface Reactions," Surface Review and Letters, vol. 6, Nos. 3 & 4 (1999) pp. 435–448.

Klaus, J.W. et al., "Atomically controlled growth of tungsten and tungsten nitride using sequential surface reactions," Applied Surface Science, vols. 162–163, pp. 479–491 (2000).

Kukli, K. et al., "Atomic Layer Epitaxy Growth of Tantalum Oxide Thin Films from $Ta(OC_2H_5)_5$ and $H_2O$," J. Electrochem. Soc., May 1995, vol. 142, vol. 142, No. 5, pp. 1670–1674.

Leskelä, M. et al., "Atomic Layer Epitaxy in Deposition of Various Oxide and Nitride Thin Films," Journal De Physique IV, Colloque C5, supplément au Journal de Physique II, Juin 1995, vol. 5, pp. C5–937–C5–951.

Martensson, P. et al., "Atomic Layer Epitaxy of Copper on Tantalum," Chemical Vapor Deposition, vol. 3, No. 1, pp. 45–50 (1997).

Martensson, P. et al., "Atomic Layer Epitaxy of Copper, Growth and Selectivity in the Cu(II)–2,2,6, 6–tetramethyl–3,5–heptanedionate/$H_2$ Process," J. Electrochem. Soc., vol. 145, No. 8, Aug. 1998, pp. 2926–2931.

Martensson, P. et al., "Use of Atomic Layer Epitaxy for Fabrication of Si/TiN/Cu Structures," J. Vac. Sci. Technol. B, vol. 17, No. 5, Sep./Oct. 1999, pp. 2122–2128.

Min, Jae–Sik et al., "Atomic Layer Deposition of TiN Films by Alternate Supply of Tetrakis (ethylmethylamino)– Titanium and Ammonia," Japanese Journal of Applied Physics, 1998, vol. 37, pp. 4999–5004.

Min, Jae–Sik et al., "Atomic Layer Deposition of TiN Thin Films by Sequential Introduction of Ti Precursor and $NH_3$," Materials Research Society Symposium Proceedings, 1998, vol. 514, pp. 337–343.

Min, Jae–Sik et al., Chemical Vapor Deposition of Ti–Si–N Films with Alternating Source Supply, Mat. Res. Soc. Symp. Proc. vol. 564, 1999 Materials Research Society, pp. 207–210.

Min, Jae–Sik et al., "Metal–organic atomic–layer deposition of titanium–silicon–nitride films," Applied Physics Letters, vol. 75, No. 11, pp. 1521–1523 (1999).

Niinistö, L. et al., "Synthesis of oxide thin films and overlayers by atomic layer epitaxy for advanced applications," Materials Science and Engineering, 1996, vol. B41, pp. 23–29.

Ott, A.W. et al., "Modification of Porous Alumina membranes Using $Al_2O_3$ Atomic Layer Controlled Deposition," Chem. Mater., vol. 9, pp. 707–714 (1997).

Ritala, M. et al., "Atomic Layer Epitaxy Growth of TiN Thin Films from $TiL_4$ and $NH_3$," J. Electrochem. Soc., Aug. 1998, vol. 145, No. 8, pp. 2914–2920.

Ritala, M. et al., "Controlled Growth of TaN, $Ta_3N_5$, and $TaO_xN_y$ Thin Filims by Atomic Layer Deposition," Chem. Mater., 1999, vol. 11, pp. 1712–1718.

Ritala, M. et al., "Perfectly Conformal TiN and $Al_2O_3$ Films Deposited by Atomic Layer Deposition," Chem Vap. Deposition 1999, vol. 5, No. 1, pp. 7–9.

Ryan, E. T. et al., "Material Property Characterization and Integration Issues for Mesoporous Silica," IEEE, 1999, pp. IITC 99–187–IITC 99–189.

Sakaue, H. et al., "Digital Chemical Vapor Deposition of $SiO_2$ Using a Repetitive Reaction of Triethylsilane/Hydrogen and Oxidation," Japanese Journal of Applied Physics, Jan. 1990, vol. 30, No. 1B, pp. L124–L127.

Sneh, O. et al., "Atomic layer growth of SiO$_2$ on Si(100) using SiCl$_4$ and H$_2$O in a binary reaction sequence," *Surface Science*, 1995, vol. 334, pp. 135–152.

Tiitta, M. et al., Preparation and Characterization of Phosphorus–Doped Aluminum Oxide Thin Films, *Materials Research Bulletin*, vol. 33, No. 9, pp. 1315–1323 (1998).

Wang, Shi–Qing, "Spin On Dielectric Films—A General Overview," *1998 5$^{th}$ International Conference on Solid–State and Integrated Circuit Technology Proceedings*, Oct. 21–23, 1998 Beijing, China, p. 961.

Wise, M. L., et al., Diethyldiethoxysiliane as a New Precursor for SiO$_2$ Growth on Silicon, *Mat. Res. Soc. Symp. Proc.*, 1994, vol. 334, pp. 37–43.

Wolf, H. et al., "Process and Equipment Simulation of Copper Chemical Vapor Deposition Using Cu(hfac)vtms," *Microelectronic Engineering*, 45 (1999) 15–27.

* cited by examiner

SEALING POROUS STRUCTURES

REFERENCE TO RELATED APPLICATION

The present application is a continuation-in-part of U.S. patent application Ser. No. 10/237,526, filed Sep. 6, 2002, which is a divisional of U.S. patent application Ser. No. 09/843,518, filed Apr. 26, 2001, issued Nov. 19, 2002 as U.S. Pat. No. 6,482,733 and claims priority under 35 U.S.C. §119(e) to U.S. provisional application No. 60/235,772 of Raaijmakers et al., filed Sep. 26, 2000 and to U.S. provisional application No. 60/204,231 of Raaijmakers et al., filed May 15, 2000. In addition, the present application is related to U.S. patent application Ser. No. 09/644,416 filed Aug. 23, 2000 and entitled CONFORMAL LINING LAYERS FOR DAMASCENE METALLIZATION

FIELD OF THE INVENTION

The invention relates generally to forming protective layers prior to alternating layer deposition (ALD). More particularly, the invention relates to forming sealing layers prior to high conformality ALD layers over porous layers in integrated circuits.

BACKGROUND OF THE INVENTION

When fabricating integrated circuits, layers of insulating, conducting and semiconducting materials are deposited and patterned to produce desired structures. "Back end" or metallization processes include contact formation and metal line or wire formation. Contact formation vertically connects conductive layers through an insulating layer. Conventionally, contact vias or openings are formed in the insulating layer, which typically comprises a form of oxide such as borophosphosilicate glass (BPSG) or an oxide formed from tetraethylorthosilicate (TEOS) precursors. The vias are then filled with conductive material, thereby interconnecting electrical devices and wiring above and below the insulating layers. The layers interconnected by vertical contacts typically include horizontal metal lines running across the integrated circuit. Such lines are conventionally formed by depositing a metal layer over the insulating layer, masking the metal layer in a desired wiring pattern, and etching away metal between the desired wires or conductive lines.

Damascene processing involves forming trenches in the pattern of the desired lines, filling or overfilling the trenches with a metal or other conductive material, and then etching the excess metal back to the insulating layer. Wires are thus left within the trenches, isolated from one another in the desired pattern. The etch back process avoids the more difficult photolithographic mask and etching processes of conventional metal line definition.

In an extension of damascene processing, a process known as dual damascene involves forming two insulating layers, typically separated by an etch stop material, and forming trenches in the upper insulating layer, as described above for damascene processing. After the trenches have been etched, a further mask is employed to etch contact vias downwardly through the floor of the trenches and the lower insulating layer to expose lower conductive elements where contacts are desired.

Conductive elements, such as gate electrodes, capacitors, contacts, runners and wiring layers, must each be electrically isolated from one another for proper integrated circuit operation. In addition to providing insulating layers around such conductive elements, care must be taken to prevent diffusion and spiking of conductive materials through the insulating layers, which can cause undesired short circuits among devices and lines. Protective barriers are often formed between via or trench walls and metals in a substrate assembly to aid in confining deposited material within the via or trench walls. Barriers are thus useful for damascene and dual damascene interconnect applications, particularly for small, fast-diffusing elements such as copper.

Candidate materials for protective barriers should foremost exhibit effective diffusion barrier properties. Additionally, the materials should demonstrate good adhesion with adjacent materials (e.g., oxide via walls, adhesion layers, etch stop layers and/or metallic materials that fill the vias and trenches). For many applications, a barrier layer is positioned in a current flow path and so must be conductive. Typically, barriers have been formed of metal nitrides ($MN_x$), such as titanium nitride (TiN), tantalum nitride (TaN), and tungsten nitride (WN), which are dense and adequately conductive for lining contact vias, wiring trenches, and other conductive barrier applications.

These lined vias or trenches are then filled with metal by any of a variety of processes, including chemical vapor deposition (CVD), physical vapor deposition (PVD), and electroplating. For effective conductivity and to avoid electromigration during operation, the metal of a contact or wiring layer should fill the via or trench without leaving voids or key holes. Completely filling deep, narrow openings with conductive material is becoming ever more challenging as integrated circuit dimensions are constantly scaled down in pursuit of faster operational processing speeds and lower power consumption.

As illustrated in FIGS. 1 and 2, utilizing a conductive barrier layer and/or other liners makes filling the trenches and vias of dual damascene processing even more difficult. FIG. 1 illustrates a dual damascene process in which an upper insulating layer 10 is formed over a lower insulating layer 12, which is in turn formed over a conductive wiring layer 14, preferably with an intervening dielectric diffusion barrier 15. This dielectric barrier 15 serves to prevent copper or other conductive material of the underlying runner 14 from diffusing into the overlying dielectric layer 12.

A mask is employed to pattern and etch trenches 16 in a desired wiring pattern. In the illustrated embodiment, the trench 16 is etched down to the level of an etch stop layer 19, which is formed between the two insulating layers 10, 12. This etch stop layer 19 is typically patterned and etched, prior to deposition of the upper insulating layer 10, to form a hard mask that defines horizontal dimensions of desired contact vias that are to extend from the bottom of the trench 16. Continued etching through the hard mask 19 opens a contact via 20 from the bottom of the trench 16 to the lower conductive wiring layer 14. FIG. 1 also shows an upper etch stop or chemical mechanical polishing (CMP) stop layer 21 over the upper insulating layer 10 to stop a later planarization step, as will be appreciated by the skilled artisan.

Protective liners 22, preferably formed of conductive material, are then formed on the exposed horizontal and sidewall surfaces. Typically, the liners 22 at least include a metal nitride, and may additionally include adhesion enhancing and seeding layers. For example, the liner 22 can comprise a tri-layer of Ti/TiN/Cu. In such a structure, the titanium layer serves to improve adhesion with exposed oxide sidewalls; the titanium nitride serves as a diffusion barrier; and a thin copper layer serves as a seed for later electroplating of copper. In other examples, the liners 22 can include tantalum nitride or tungsten nitride barriers. The skilled artisan will appreciate that other barrier materials can also be employed.

Conformal deposition of the liners 22, however, is very difficult with conventional processing. For example, physical vapor deposition (PVD), such as sputtering, of a metal layer (for adhesion, barrier and/or seed layer) requires at least about 50 Å over all surfaces of the trench 16 and contact via 20. Unfortunately, PVD of metal into high aspect ratio voids necessitates much greater deposition on the top surfaces of the workpiece to produce adequate coverage of the via bottom. For example, typical state-of-the-art trench and contact structures for dual damascene schemes require about 500 Å PVD metal in order for 50 Å of metal to reach the bottom and sidewalls of the contact via 20.

This poor step coverage is a result of the high aspect ratio of voids formed for dual damascene processing in today's integrated circuit designs. The aspect ratio of a contact via is defined as the ratio of depth or height to width. In the case of dual damascene contacts, the trench 16 and contact via 20 together reach through two levels of insulating layers 10, 12, such that the effective aspect ratio of the via 20 is very high.

Conventional deposition processes produce very poor step coverage (i.e., the ratio of sidewall coverage to field or horizontal surface coverage) of such high aspect ratio vias for a variety of reasons. Due to the directionality of PVD techniques, for example, deposition tends to accumulate more rapidly at upper corners 26 of the trench 16 and upper corners 28 of the via 20, as compared to the via bottom 30. As a result of the rapid build-up of deposited material on the upper surfaces of the structure, the liners occupy much of the conductive line width in the trench 16 and even more, proportionately, of the contact via 20. These built-up corners 26, 28 then cast a shadow into the lower reaches of the structure, such that lower surfaces, and particularly lower corners, are sheltered from further deposition. Although PVD deposition can be directed more specifically to the via bottom, e.g., by collimation or by ionization of the depositing vapor, such additional directionality tends to sacrifice sidewall coverage.

Chemical vapor deposition (CVD) processes have been developed for certain metals and metal nitrides. CVD tends to exhibit better step coverage than PVD processes. In order for CVD processes to exhibit good step coverage, the reaction must be operated in the so-called "surface controlled" regime. In this regime, reaction species do not adhere to trench or via walls upon initial impingement. Rather, the species bounce off trench/via surfaces several times (e.g., 10–500 times) before reacting.

State-of-the-art CVD processes for depositing barrier layers at temperatures sufficiently low to be compatible with surrounding materials do not operate completely within the surface-controlled regime. Accordingly, even CVD processes tend to deposit far less material at the bottom of a dual damascene contact via 20 then on the upper surfaces and sidewalls of the structure. The upper corners of the trench 16 and the contact via 20 represent a high concentration of surface area to volume. Deposition upon the horizontal upper surfaces and adjacent vertical sidewall surfaces merge together to result in an increased deposition rate near the corners 26, 28. Additionally, flowing reactants diffuse slowly into the confined spaces of the trench 16 and contact via 20. Accordingly, the concentration of reactants reaching the via bottom 30 is far reduced relative to the concentration of reactants reaching upper surfaces of the structure. Thus, while somewhat improved relative to PVD, CVD step coverage of dual damascene structures remains uneven with most currently known low temperature CVD techniques.

In the pursuit of faster operational speeds and lower power consumption, dimensions within integrated circuits are constantly being scaled down. With continued scaling, the aspect ratio of contacts and trenches continues to increase. This is due to the fact that, while the width or horizontal dimensions of structures in integrated circuits continues to shrink, the thickness of insulating layers separating metal layers cannot be commensurately reduced. Reduction of the thickness in the insulating layers is limited by the phenomenon of parasitic capacitance, whereby charged carriers are slowed down or tied up by capacitance across dielectric layers sandwiched by conductive wires. As is known, such parasitic capacitance would become disabling if the insulating layer were made proportionately thinner as horizontal dimensions are scaled down.

With reference to FIG. 2, a scaled-down version of FIG. 1 is depicted, wherein like parts are referenced by like numerals with the addition of the suffix "a." As shown, continued scaling leads to a more pronounced effect of uneven step coverage while lining dual damascene structures. Material build-up at the corners 28a of the contact via 20a quickly reduces the size of the opening, even further reducing the concentration of reactants that reach into the contact via 20a. Accordingly, coverage of the via bottom surface 30a drops off even faster. Moreover, the percentage of the trench 16a occupied by the liner materials is much greater for the scaled down structure of FIG. 2. Since the lining material is typically less conductive than the subsequent filler metal (e.g., copper), overall conductivity is reduced. Worse yet, cusps at the corners 28a of the contact via can pinch off before the bottom 30a is sufficiently covered, or during deposition of the filler metal.

Independently of efforts to improve barrier film uniformity are efforts to reduce the dielectric or permittivity constant (k) value of the interlevel dielectric (ILD) material. A reduced dielectric constant value results in less parasitic capacitance per unit thickness of the ILD, such that for a given circuit design tolerance for parasitic capacitance, a so-called "low k" material can provide a thinner ILD. "Low k" designates a material with a k value below that of silicon oxide (k≈4), the currently predominant ILD material in integrated circuit fabrication. Accordingly, the aspect ratio of contacts and trenches to be filled can be reduced and lining these openings becomes easier.

A variety of materials and techniques are being developed for producing low k films in integrated circuits. Deposition methods currently include spin-on deposition, CVD, plasma enhanced CVD (PECVD) and high density plasma (HDP) CVD, depending upon the characteristics desired. Some of the methods and films have been described by Laura Peters, "Pursuing the Perfect Low-k Dielectric" *Semiconductor International*, Vol. 21, No. 10 (September 1998), and the references cited therein. Some films have a k value from 3 to 3.5 such as hydrogen silsesquioxane (HSQ) and fluorinated oxides. Organic polymers, such as benzoncyclobutene (BCB) and polyarylene ethers (PAE), exhibit even lower k values between 2.5 and 3 range. Other work with polytetrafluoroethylene (PTFE) using spin-on techniques has achieved intrisic k values of about 1.9. Other companies have created nanoporous inorganic-organic hybrids.

Use of such low k materials as an ILD in an integrated circuit will considerably reduce the aspect ratios of openings in the ILD. Accordingly, lining such openings with adequate conformality should prove simpler as compared with lining openings with higher aspect ratios.

Integrating these new materials with existing technologies, however, introduces its own challenges.

Among other requirements, low k films must exhibit high chemical, thermal and mechanical stability in the face of disparate adjacent materials and exposure to a variety of processing environments. ILD materials should be compatible with etching, deposition, cleaning and polishing processes in order to integrate reliably with a manufacturing process. As will be appreciated by the skilled artisan, integration of new materials and processes into established process flows is rarely a straightforward matter, as evidenced by complications arising from the introduction of copper lines into state-of-the-art integrated circuit designs.

It would accordingly be advantageous to provide low k material without changing the material characteristics of the ILD with each succeeding generation. One manner in which the k value of a material can be lowered without changing the material properties of the ILD is to make the material porous. In effect, porous dielectrics combine the dielectric strength of air ($k \approx 1.0$) with that of the dielectric material in which the pores are formed. Advantageously, the k value of a porous material is "tunable" in the sense that the k value can be altered without introducing new materials by changing the porosity of a material that has already been integrated.

Currently silicon oxide ($k \approx 4$) is widely used in process flows. Porous versions of silicon oxide or "silica" can have both a low k value and compatibility with current process flows. This has led to the development of classes of porous silica known as nanogels, aerogels, xerogels and mesogels. Similarly, newer low k materials, once integrated into process flows, can have their k values tuned by adjusting porosity of the low k material. With low k materials currently under development, it appears that achieving k values below 2.5 will likely involve providing a porous insulating material.

While low k films, and particularly porous low k films, can effectively lower the aspect ratio of openings in an ILD, room remains for improvements in lining technology. Although CVD and PVD may adequately line a low aspect ratio opening, non-conformality of conventional deposition techniques can still be problematic.

Accordingly, a need exists for more effective methods of lining openings in integrated circuits, particularly in the context of dual damascene metallization.

SUMMARY OF THE INVENTION

In satisfaction of this need, methods are provided herein for depositing lining materials into the high-aspect ratio trenches and contact vias of dual damascene metallization schemes. Advantageously, the methods attain high step coverage, such that only the minimum required thickness of the lining layer need be formed on all surfaces. Examples are provided for applying the methods to formation of one or more of adhesion, barrier and electroplating seed layers.

In general, the methods comprise cycles of alternating reactant phases, wherein each phase has a self-limiting effect. "Pure" metal layers, for example, can be formed by alternately adsorbing self-saturating halide- or organic-terminated metal monolayers and reducing the metal-containing monolayer. Metal nitrides suitable for conductive diffusion barriers can be formed by alternately adsorbing self-terminated metal-containing monolayers and conducting ligand exchange reactions, substituting nitrogen-containing species for halogen or organic tails on the metal-containing monolayers. Alternatively, the tails of the self-terminated metal-containing monolayer can be reduced or otherwise removed in an intermediate scavenger or getter phase prior to the nitrogen phase.

More particularly, the methods are applied to metallization structures formed in porous "low k" materials. Prior to the highly conformal self-saturating processes noted above, a sealing layer is first formed over exposed porous surfaces, blocking the pores. The conformal self-saturating processes cannot then penetrate the pores and the low k dielectric maintains its desired properties. Advantageously, the sealing layer can be metal and subsequent uniformly thick conductive layers can be formed within high-aspect ratio openings (e.g., trenches and vias), desirably as thin as possible consistent with their respective functions, and without risking short circuits through the porous insulating layer. The remaining volume within such openings is thus maximized, facilitating a greater proportionate volume of more highly conductive filler materials, such as copper for metal runners and integral contacts.

For some structures with openings, pores have been found to be particularly problematic for upper surfaces of the structures, such as low k layers that have been found to have primarily vertically aligned pores. Accordingly, it may be desirable to seal or block such upper surface pores without the same concerns for pores on sidewall surfaces deep within openings like trenches.

In one embodiment, such surfaces can be sealed or blocked without depositing a layer. Rather, the upper surface can be morphed or reformed to a selected depth, such that the pores close to the upper surfaces collapse. For example, targeted energy (e.g., pulsed laser or radiant heat) can be provided such that the upper surface to a selected depth is melted. Where the surfaces are found in an interlevel dielectric (ILD) of an integrated circuit, the depth is desirably selected to be close to the minimum depth necessary to ensure that subsequent depositions do not risk short circuiting current across the ILD In another embodiment, a sealing layer is formed. Similar to sealing damascene structures in conventional low k porous materials, the sealing layer is desirably less conformal than that of conventional atomic layer deposition (ALD). Traditionally, ALD affords near perfect conformality from upper surfaces, along sidewall surfaces, and along bottom surfaces. In this embodiment, it is desirable to afford reduced conformality, such that reduced film thickness results along inner surfaces of openings in the substrate. Thus, conventional CVD and PVD processes can be employed for such a sealing layer.

In a particularly preferred arrangement, however, methods described herein allow tailored conformality, ranging from near perfect conformality of ALD to the level of conformality afforded by chemical vapor deposition (CVD). The inventors have discovered that such tailoring can be useful for a variety of situations in which differential conformality is desired for different structures. For example, the low k layers that have been found to have primarily vertically aligned pores may call for a different level of conformality as compared to the conventional porous low k materials. Whereas coverage of sidewall trench/via surfaces is desired for conventional, isotropically porous layers, such sidewall coverage is not necessary when only horizontal surfaces open into continuous pores. In fact, it may be advantageous to avoid full coverage of the sidewalls for a variety of reasons, such as for leaving maximum room in trenches and vias for highly conductive material (e.g., copper), or for avoiding a directional etch to open up a conductivity path on the bottom of the trenches or vias when an insulating sealing layer is selected.

Accordingly, in accordance with another aspect of the present invention, a method is provided for fabricating an integrated circuit that includes a porous insulating layer having a plurality of trenches extending from an upper surface of the insulating layer. The method includes blocking the pores on an exposed surface of the insulating layer. Blocking is performed preferentially upon upper surfaces of the insulating layer. After blocking the pores, no more than about one monolayer of a first reactant species is formed in a self-limited and self-saturating reaction. A second reactant species then reacts with the monolayer. In one embodiment, blocking is conducted by melting upper surfaces of the substrate. In another embodiment, blocking is conducted by a nonconformal deposition.

In accordance with another aspect of the invention, a method is provided for depositing a film over a structure having openings therein. The method includes an alternating deposition process, whereby a plurality of sequential reactant pulses are separated from one another. This alternating process is optimized to achieve a level of conformality between that of atomic layer deposition (ALD) and chemical vapor deposition.

In accordance with another aspect of the invention, a method is provided for controlling conformality of a deposited film on a semiconductor substrate. The method includes providing the substrate with a plurality of openings at a surface thereof. A sequence is provided of at least two different, mutually reactive reactants in temporally separated and alternating reactant pulses. Separations of the reactant pulses and durations of the reactant pulses are selected to control the conformality of the film deposited in the openings in the surface of the semiconductor substrate, wherein the separations and durations are selected to achieve reduced conformality compared to a corresponding atomic layer deposition (ALD) process that is optimized to achieve maximum conformality with minimum cycle length for the substrate topography. The semiconductor substrate is exposed to the sequence of the reactant pulses with the selected separations and durations to deposit the film.

In accordance with another aspect of the invention, a semiconductor fabrication process includes providing a low k dielectric having an anisotropic pore structure and larger openings therein. An upper surface of the low k dielectric layer is preferentially sealed. An atomic layer deposition process is then conducted to deposit directly over the sealed upper surface.

In accordance with another aspect of the invention, a method for deposition of a film on a semiconductor substrate includes providing the substrate with a surface having different regions with different levels of accessibility. A sequence of at least two different, mutually reactive reactants is provided with temporally separated and alternating reactant pulses. Separation of the reactant pulses and/or duration of the reactant pulses are selected to achieve self-saturation and self-limiting atomic layer deposition (ALD) mode deposition on the most accessible regions on the substrate surface and depletion effects in less accessible regions on the substrate surface. The semiconductor substrate is exposed to the sequence of the reactant pulses with the selected temporal separation and duration to deposit the film.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

FIGS. 5–13 are schematic cross-sections of a partially fabricated integrated circuit, generally illustrating the construction, lining and filling of a trench and via formed in insulating layers above a semiconductor substrate, in accordance with a preferred dual damascene process flow.

FIG. 5 shows a first or lower insulating layer 50 over a barrier layer 51 and a conductive element 52 which forms part of a lower interconnect layer.

FIG. 6 shows the structure of FIG. 5 after an etch stop layer or hard mask 54 is formed over the insulating layer 50.

FIG. 7 shows the structure of FIG. 6 after a mask and etch process has transferred a pattern of openings 55 to the etch stop 54.

FIG. 8 shows the structure of FIG. 7 after a second or upper insulating layer 56 has been formed over the etch stop layer 54 and a second etch or CMP stop layer 58 have been formed over the upper insulating layer 56.

FIG. 9b shows a non-capped dual damascene structure with a higher effective aspect ratio resulting from mask misalignment.

FIG. 9c shows a contact via 62 that is not fully landed, with a small but very high aspect ratio overetch hole 72.

FIG. 9d shows cavities 80 resulting from a selective etch from the via bottom.

FIG. 9e depicts a damascene structure with a barrel-shaped profile in the trench 60 and via 61 resulting from attack on the insulating layers 50, 56 during removal of photoresist.

FIG. 11 shows the dual damascene structure of FIG. 10a after additional lining with a lining layer 150 and a seed layer 155.

FIG. 12 shows the dual damascene structure of FIG. 11 filled with a highly conductive metal 160.

FIG. 13 shows the filled damascene structure of FIG. 12 with isolated lines 170 formed by planarization by chemical mechanical planarization (CMP) or other etch back process.

DETAILED DESCRIPTION OF THE PREFERRED EMBODIMENT

Though described in the context of certain preferred materials, it will be understood, in view of the disclosure herein, that the methods and structures described will have application to a variety of other materials for lining damascene structures.

As discussed in the Background section above, lining damascene structures, and particularly dual damascene structures, by physical vapor deposition (PVD) and conventional chemical vapor deposition (CVD) disadvantageously fills a large volume of the trenches and contact vias. Accordingly, less room is left for the highly conductive filler material to follow. Use of a thinner liner material would leave more room for highly conductive filler metals such as copper which would, in turn, increase conductivity and operational signal transmission speeds for the integrated circuit. Conventional methods such as PVD and CVD, by their very nature, produce thicker layers towards the upper end of the damascene structure than at the bottom. While much research has been devoted to obtaining more conformal step coverage of dual damascene trenches and contact vias, it is very difficult to supply the same concentration of reactant species (or PVD sputtered material) to all surfaces of such structures. In particular, it is difficult to supply the same concentration of depositing species at the upper surfaces of such structures as supplied to the bottom of deep, confined contact vias that extend from the bottom of an already-deep trench.

By providing almost perfect step coverage, the preferred embodiments advantageously obtain the minimum necessary thickness for the desired liner layers over all surfaces of trenches and contact vias in a dual damascene structure. Desirably, the methods of the preferred embodiment are less dependent upon the relative concentration of reactant species in upper regions as compared to lower regions of the trench and contact via.

Figure 5:
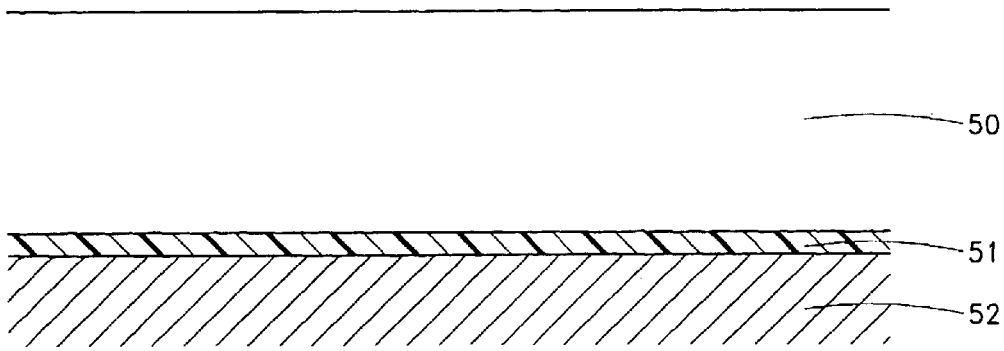
Figure 6:
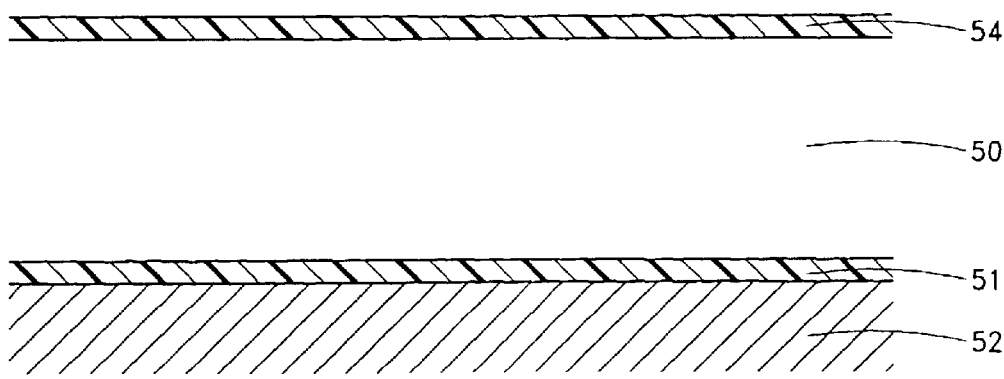
Figure 7:
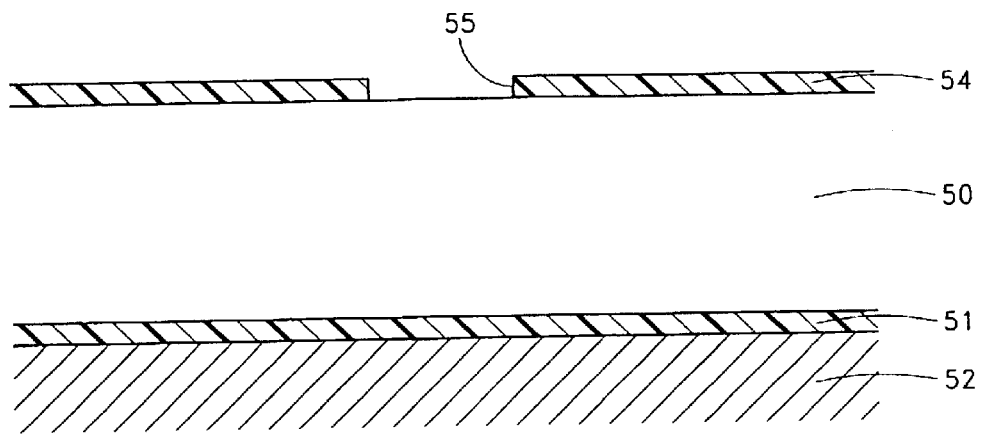
Figure 8:
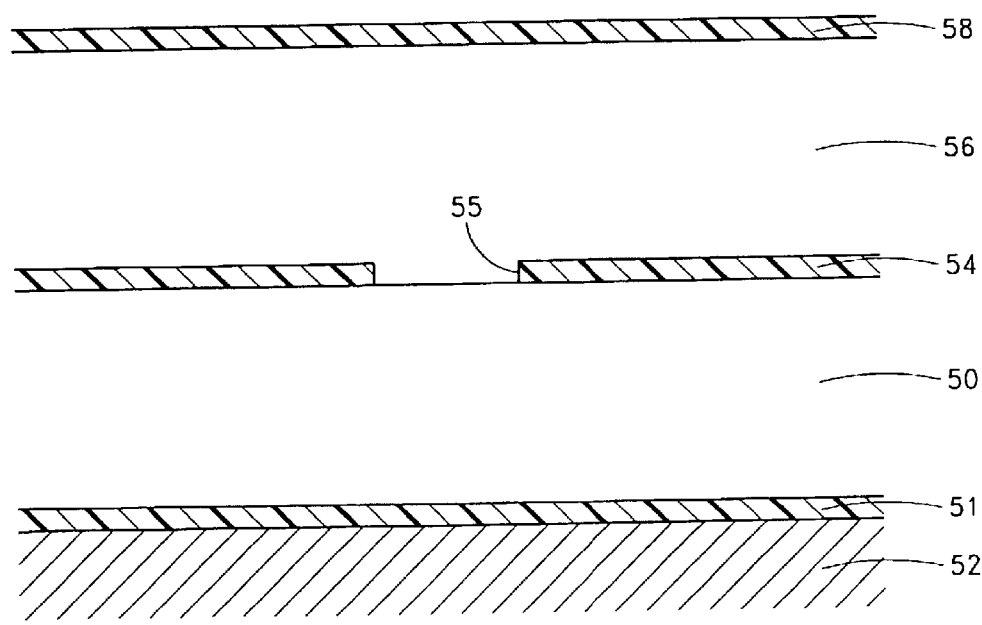

With reference to FIGS. 5–8, insulating layers are formed over a semiconductor substrate, in accordance with the preferred embodiments. Referring initially to FIG. 5, a first or lower insulating layer 50 is formed over a barrier layer 51 and a conductive element 52, which forms part of a lower interconnect layer in the illustrated embodiment. As will be appreciated by the skilled artisan, metallization schemes typically employ one metal composition throughout various wiring layers (e.g., copper interconnects or aluminum interconnects). The preferred embodiments are adaptable to many different materials, but certain embodiments are particularly adapted to lining damascene structures wherein the via floor or lower conductive element 52 comprises a highly conductive copper line. The first insulating layer 50 is preferably formed to a thickness sufficient to insulate the lower conductive element 52 from upper wiring structures to be formed. An etch stop layer or hard mask 54 (FIGS. 6–7) is formed over the lower insulating layer 50 and a second or upper insulating layer 56 (FIG. 8) is formed over the etch stop layer 54. A second etch or CMP stop layer 58 (also known as a shield layer) is preferably also formed over the upper insulating layer 56.

In the illustrated embodiment, each of the lower and upper insulating layers 50, 56 comprise dielectric materials with a thickness less than about 1.0 µm, more preferably less than about 0.8 µm, and most preferably less than about 0.6 µm. The skilled artisan will readily appreciate that the insulating layer can comprise any of a number of suitable dielectric materials. For example, dielectric materials have recently been developed that exhibit low permittivity (low k), as compared to conventional oxides. These low k dielectric materials include polymeric materials, porous materials and fluorine-doped oxides. The present methods of lining trenches and contact vias have particular utility in conjunction with such low k materials.

The illustrated insulating layers 50, 56 thus comprise low k materials, and more particularly porous low k materials, exhibiting a dielectric constant (k) less than about 3.5. Preferably, the k value of the insulating layers is less than about 3.0, more preferably less than about 2.5, and most preferably less than about 2.0.

As set forth in the Background section above, increasing porosity effectively lowers dielectric constant. Accordingly, maximum advantage of the low k material's reduction of parasitic capacitance occurs with maximum porosity. This advantage is balanced against issues of mechanical, chemical and thermal stability during further processing, some of which issues can be resolved by techniques independent of adjusting porosity. While the methods disclosed herein are applicable to insulating layers with any level of porosity, the porosity of the low k films 50, 56 is desirably greater than about 50%, more preferably greater than about 70% and most preferably greater than about 75%.

An exemplary porous low k material is a spin-on material commercially available under the trade name Nanoglass™ from Honeywell Advanced Microelectronic Materials (AMM) of Sunnyvale, Calif. (formerly Allied Signal). Nanoglass™ is a nanoporous silica with a k value between 2.5 and 1.3 for porosity levels of 50% to 90%. The currently available commercial version of Nanoglass™ has a dielectric constant value of about 2.0 with a porosity of about 70%. A study on an earlier version of Nanoglass™ (Nanoglass K2.2-A10B) found this less porous version of xerogel to have completely connected pores with an average pore size of about 4 nm (40 Å). Ryan et al., "Material property characterization and integration issues for mesoporous silica" *Proceedings of the IEEE,* 1999 *International Inter-* connect Technology Conference (1999), pp. 187–189. The skilled artisan will readily appreciate, however, that the methods disclosed herein are applicable a variety of other materials having different levels of porosity.

The etch stop layers 54, 58 of the illustrated embodiment each comprise a material exhibiting different etch rates relative to the insulating layers 50, 56, allowing better control of etching processes. In the illustrated embodiment, the etch stop layers 54, 58 comprise silicon nitride ($Si_3N_4$), preferably provided to a thickness of between about 100 Å and 700 Å, and more preferably between about 200 Å and 500 Å. The lower barrier layer 51 preferably also comprises $Si_3N_4$. It will be understood that the etch-stop layers 54, 58 can also serve to strengthen the underlying porous insulating layers 50, 56. As disclosed in Ryan et al., cited in the previous paragraph, a 1,000 Å CVD oxide cap can be employed to improve resilience during subsequent CMP processing, and can also serve as the end-point when polishing overlying metal.

As discussed in the Background section above, after the lower insulating layer 50 and etch stop 54 are formed (FIGS. 5 and 6), a mask and etch process transfers a pattern of openings 55 (one shown in FIG. 7) to the etch stop 54. The second or upper insulating layer 56 and optional CMP stop 58 are then formed over the hard mask 54.

Figure 9A:
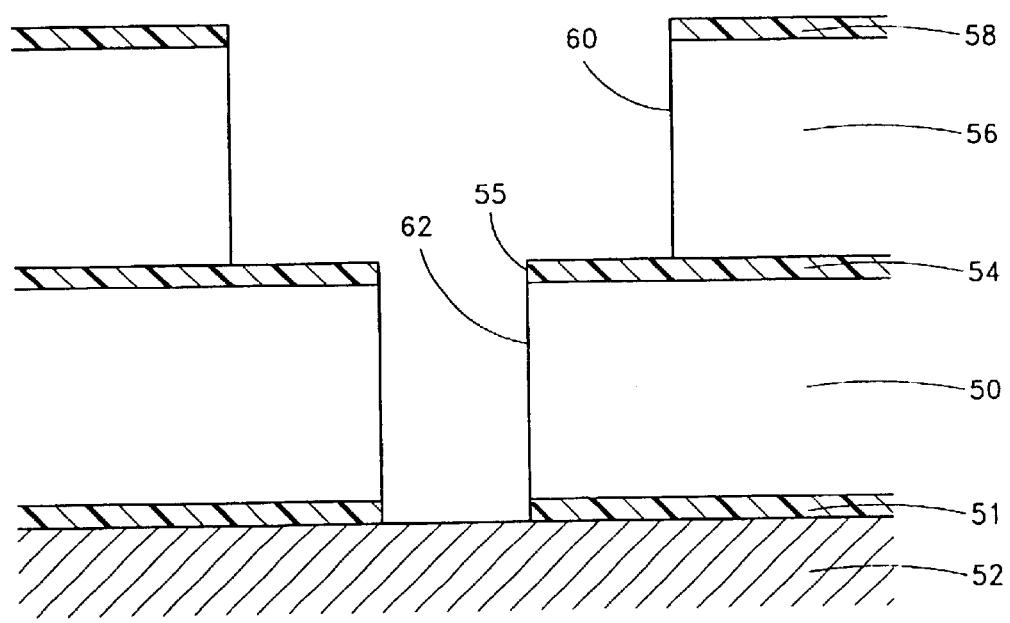
FIG. 9a shows the structure of FIG. 8 after trenches 60 (one shown) and contact vias 62 (one shown) have been etched to form a dual damascene structure.

With reference now to FIG. 9a, the substrate is masked and trenches 60 (one shown) are etched through the upper insulating layer 56, preferably stopping on exposed portions of the first etch stop layer 54. As will be understood by the skilled artisan, the trenches 60 are etched across the insulating layer 56 in patterns desired for metal lines, in accordance with an integrated circuit design. In the illustrated embodiment, the width of the trench is less than about 0.35 μm and more preferably less than about 0.25 μm.

Continued etching through the hard mask 54 defines contact vias 62 (one shown) extending downwardly from the bottom of the trench and through the lower insulating layer 50 to expose conductive elements below (e.g., metal line 52). The contact vias 62 are defined by the openings 55 in the hard mask 54 at discrete locations along the trenches 60. Desirably, the contact vias 62 have a width of less than about 0.35 μm and more preferably between about 0.05 μm and 0.25 μm. The width or the diameter of a contact via 62 can be equal to or slightly less than the line width defined by the trench 60 above.

The effective aspect ratio (depth: width) of the contact via 62 is therefore preferably greater than about 1:1. Since the effective depth of the contact via 62 is defined through both insulating layers 50, 56, the effective aspect ratio is more preferably greater than about 2:1, and most preferably between about 2:1 and 4:1. The preferred embodiments will have particular utility in connection with future generation devices, whereby line widths and contact widths will shrink even further. Advantageously, the employment of relatively thin low k dielectrics for the insulating layers 50, 56 reduces the aspect ratio relative to an equivalent design using conventional silicon oxides (k≈4).

With reference to FIGS. 9b to 9e, the preferred embodiments also have particular utility in conjunction with variations on the dual damascene structure of FIG. 9a. Parts similar to those of FIG. 9a will be referred to by like reference numerals.

Figure 9B:
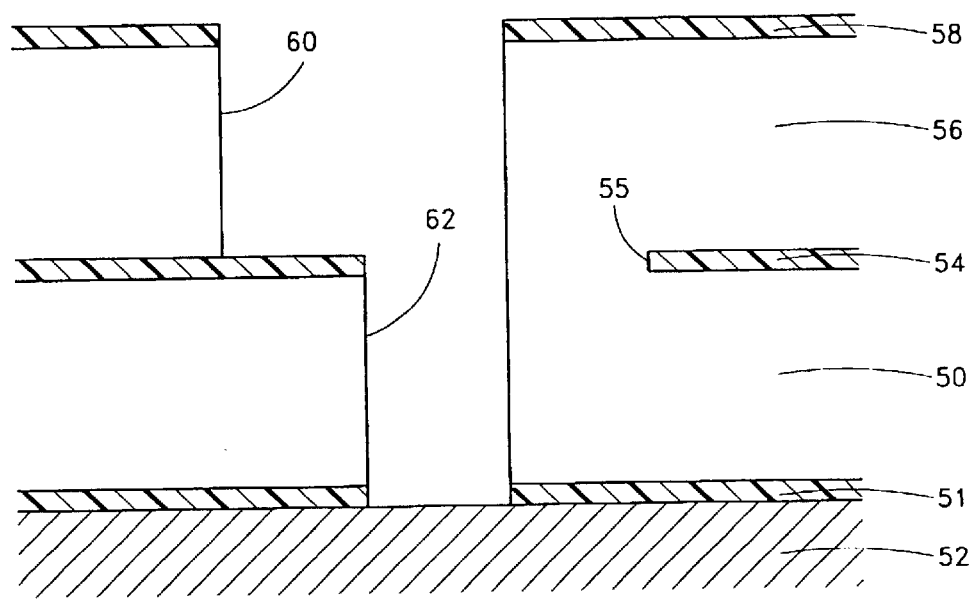
FIGS. 9b through 9e show non-ideal damascene structures.

Referring to FIG. 9b, a non-capped dual damascene structure is shown. When non-capped vias 62 are allowed by design rules (and they are desirable for obtaining higher circuit densities), mask misalignment can lead to even greater aspect ratios. As one via sidewall is withdrawn from the corresponding edge of the opening 55 defined by the hard mask 54, the effective contact size decreases, such that aspect ratios can easily be double those listed above for the illustrated embodiment of FIG. 9a.

Figure 9C:
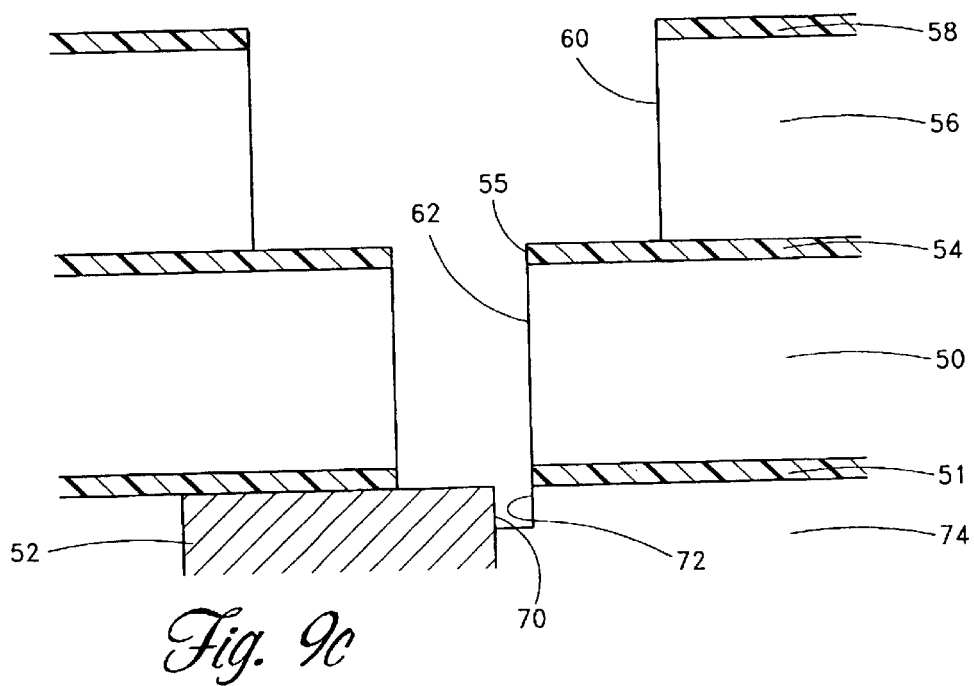

Referring now to FIG. 9c, vias that are not fully landed similarly exhibit higher effective aspect ratios. Under such circumstances, the opening 55 of the hard mask 54 overlaps with an edge 70 of the conductive circuit element 52. Small but very high aspect ratio overetch holes 72 are formed in an insulating or dielectric layer 74 surrounding the circuit element 52. The depth of the overetched hole 72 will depend, of course, on the etch selectivity between the barrier layer 51 and the surrounding dielectric 74.

Figure 9D:
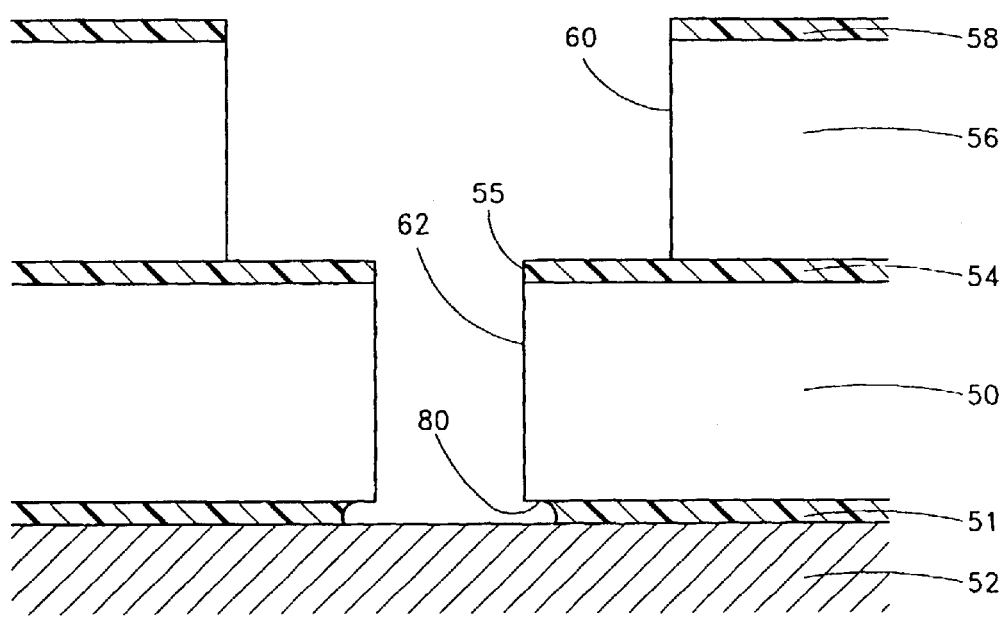

FIG. 9d illustrates the effect of undercutting the barrier layer 51 during via etch. When the barrier 51 is etched by a selective etch from the via bottom to expose the underlying circuit element 52, the barrier 51 tends to be laterally recessed. The resultant cavities 80 are very difficult to line by conventional processes.

Figure 9E:
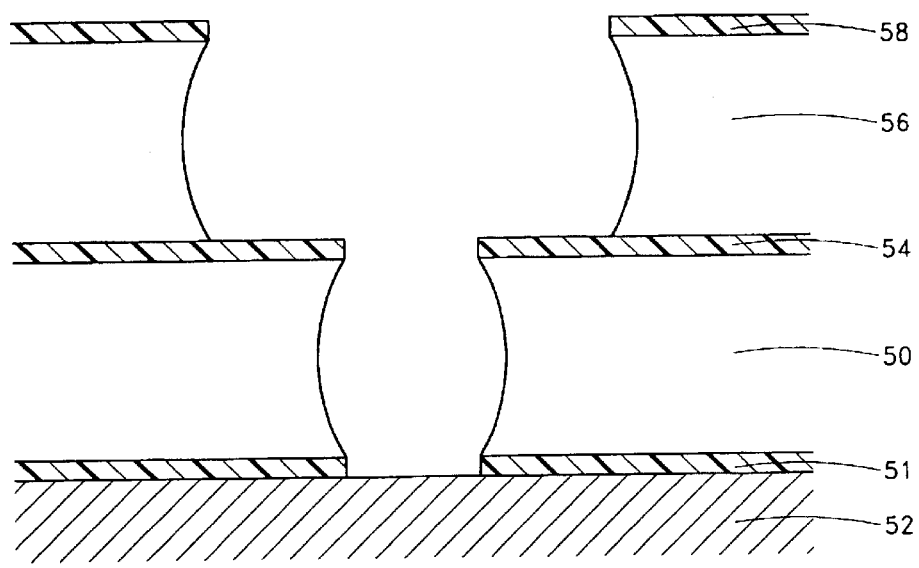

FIG. 9e illustrates yet another non-ideal damascene structure. When removing photoresist employed to pattern the structure, insulating layers 50, 56 formed of low k dielectrics are susceptible to attack, leaving a barrel-shaped profile in the trench 60 and via 61. This structure is also difficult to effectively line and fill by conventional processing.

Similarly, many other non-ideal conditions can result in other re-entrant profiles, cavities and/or extremely high aspect ratios for dual damascene trenches and vias. Under such circumstances, conventional processing is inadequate for lining and filling these structures without forming voids. The methods of the preferred embodiments, in contrast, can effectively line even the unusual or aberrant structures of FIGS. 9b to 9e. Moreover, the skilled artisan will readily find application for the methods and films disclosed herein beyond the dual damascene context. For example, the methods disclosed herein can also be used effectively for lining trenches in single damascene wiring schemes or for lining conventional contact vias and openings. The methods of lining have particular utility in conjunction with dual damascene process flows employing porous low k materials.

Methods of Forming Conformal Liners

The damascene structure so formed is thereafter lined with high step coverage. In accordance with the preferred embodiments, lining layers are formed by a periodic process in which each cycle deposits, reacts or adsorbs a layer upon the workpiece in a self-limiting manner. Preferably, each cycle comprises at least two distinct phases, wherein each phase is a saturative reaction with a self-limiting effect, leaving no more than about one atomic monolayer of the desired liner material.

Figure 1:
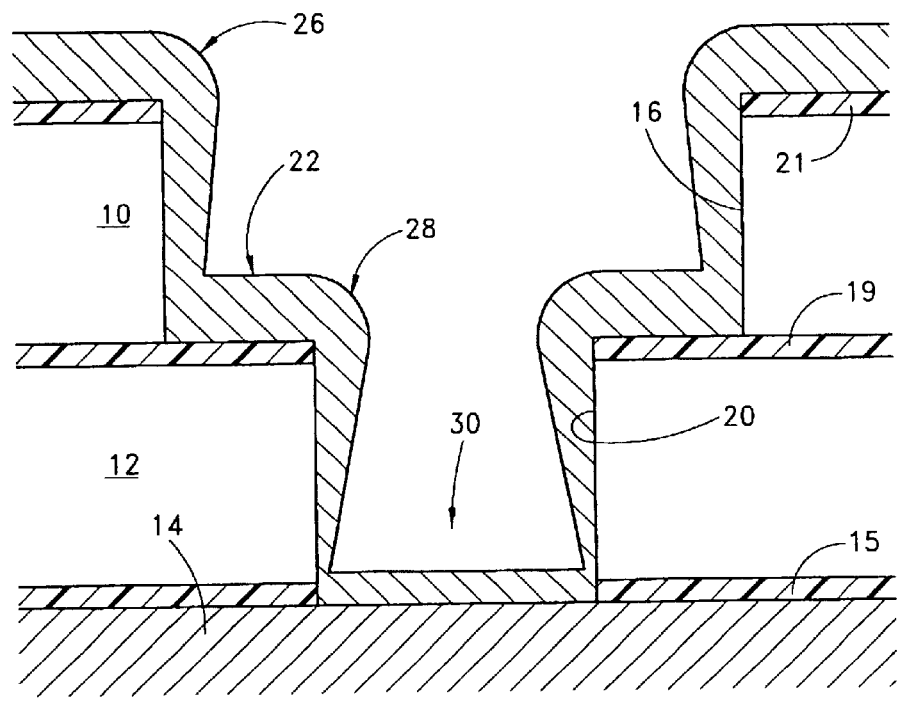
FIG. 1 is a schematic cross-section of a dual damascene structure having a conventional barrier layer lining the trench and contact via thereof.
Figure 2:
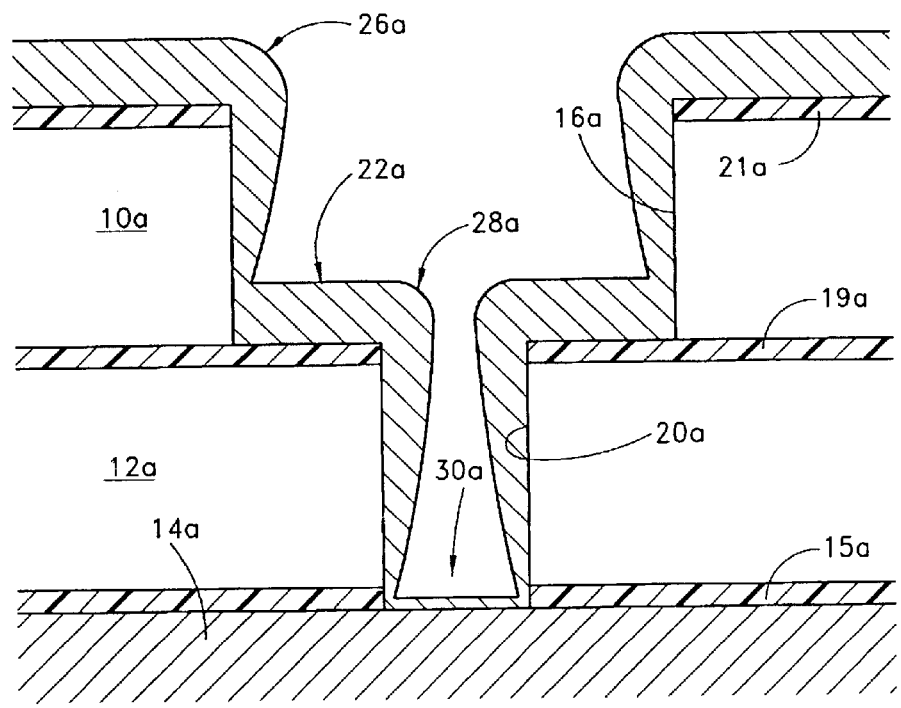
FIG. 2 generally illustrates a lined dual damascene structure, similar to FIG. 1, for a scaled-down integrated circuit.
Figure 3:
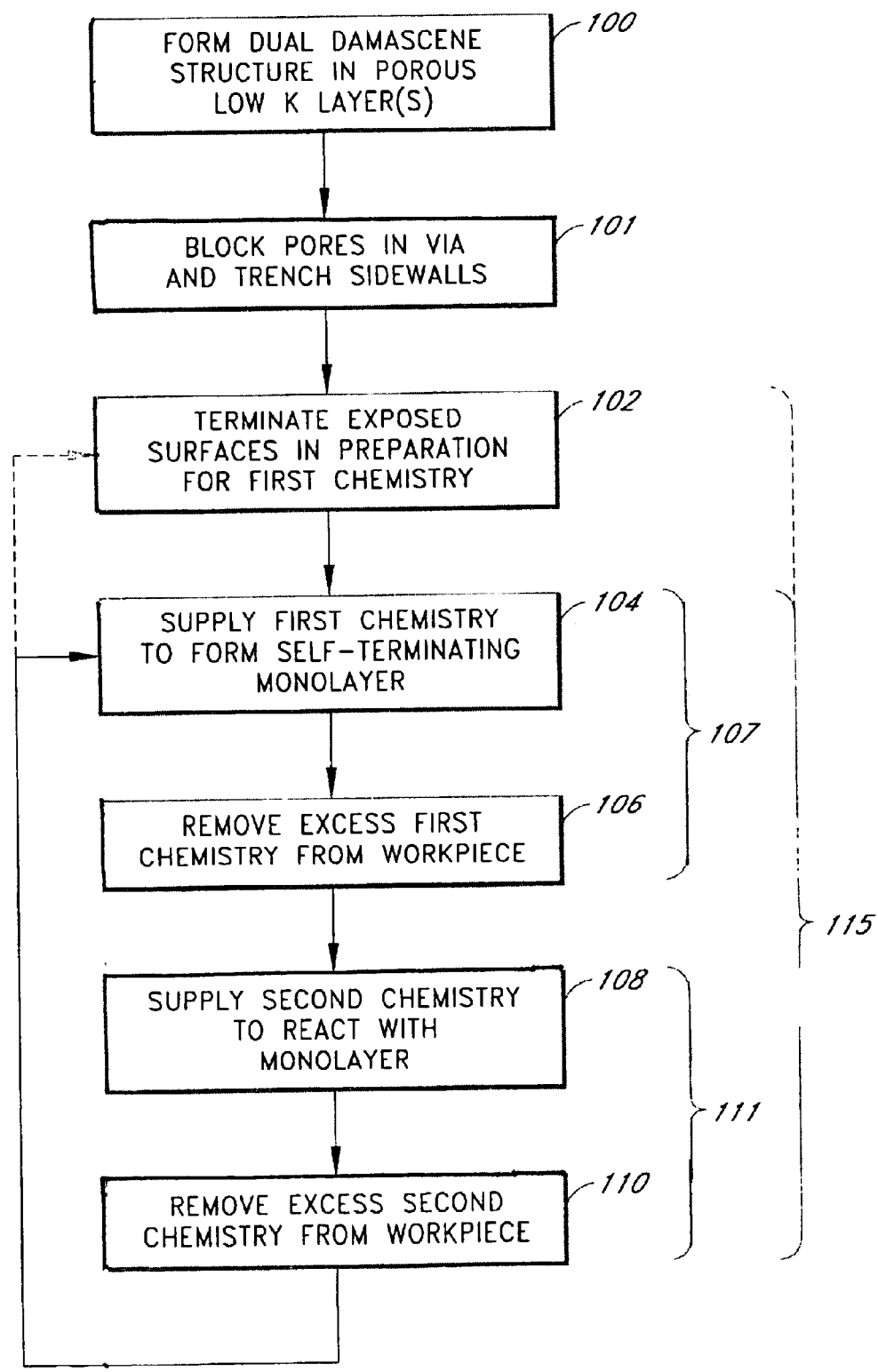
FIG. 3 is a flow chart generally illustrating a method of lining high aspect ratio, dual damascene structures prior to filling with a more highly conductive material.

FIG. 3 generally illustrates a method of forming damascene lining layers with high step coverage. The preferred method includes at least one process step that is a form of atomic layer deposition (ALD), whereby reactants are supplied to the workpiece in alternating pulses in a cycle. Preferably, each cycle forms no more than about one monolayer of lining material by adsorption and preferably by chemisorption. The substrate temperature is kept within a window facilitating chemisorption. In particular, the substrate temperature is maintained at a temperature low enough to maintain intact bonds between adsorbed species and the underlying surface, and to prevent decomposition of the reactant species. On the other hand, the substrate temperature is maintained at a high enough level to avoid condensation of reactants and to provide the activation energy for the desired surface reactions in each phase. Of course, the appropriate temperature window for any given ALD reaction will depend upon the surface termination and reactant species involved.

Each pulse or phase of each cycle is preferably self-limiting in effect. In the examples set forth below, each of the phases are self-terminating (i.e., an adsorbed and preferably chemisorbed monolayer is left with a surface non-reactive with the chemistry of that phase). An excess of reactant precursors is supplied in each phase to saturate the structure surfaces. Surface saturation ensures reactant occupation of all available reactive sites (subject to physical size restraints, as discussed in more detail below), while self-termination prevents excess film growth at locations subject to longer exposure to the reactants. Together, saturation and self-terminating chemistries ensure excellent step coverage.

The step coverage is so high that, without precautions, the process could coat the pores of the preferred low k insulating layers 50, 56 (FIG. 10a) with conductive reactants. Such a result risks conductive paths or short circuits through the insulating layers 50, 56. The inventors have recognized that this risk is particularly high for the preferred reactants set forth in the tables below, especially for metal halides. Accordingly, the process of the preferred embodiments includes blocking pores on the via and trench sidewalls and/or top surfaces prior to highly conformal ALD processes that line the dual damascene structure with conductive material.

As illustrated, the process in accordance with the preferred embodiments begins with formation 100 of a dual damascene structure, such as those illustrated in FIGS. 9a to 9e and discussed above. As noted, the structure includes porous low k materials.

After formation 100, surfaces of the low k material (in the present embodiment including at least the sidewalls of the vias and trenches) are subjected to a process that seals or blocks 101 pores of the low k insulating layer(s). Preferably, blocking 101 comprises a relatively low conformality deposition that pinches off pores prior to a more highly conformal ALD deposition. As set forth in more detail below, the sealing or blocking process 101 can comprise a conventional deposition, such as CVD or PVD, or can itself comprise an alternating deposition process optimized to block the pores prior to significant diffusion of reactants through the porous low k material. As will be better appreciated in view of the discussion of FIGS. 20–22 below, in other arrangements the sealing or blocking process 101 can focus on upper or horizontal surfaces of the structure. In addition to deposition, blocking 101 can comprise a reforming process to collapse or otherwise seal the pore openings at such upper surfaces, such as by melting or targeted annealing.

The blocking process 101 can form an insulating layer to seal or block the pores, but more preferably deposits a conductive material. Advantageously, when sealing with a conductive material, quality control to determine whether conductive material has excessively penetrated the porous material will simultaneously determine whether the insulating layers remain sufficiently porous to lower the k value of the insulator in accordance with the circuit design. Furthermore, with conductive sealant, limited volume within the openings (vias and trenches) is occupied by conductive material, rather than insulating material, and no further process is required for opening electrical contact to via floor prior to the highly conformal ALD process.

If necessary, the exposed surfaces of the dual damascene structure (e.g., the blocking layer over porous trench and via sidewall surfaces, the metal floor shown in FIG. 9a in the case of an insulating blocking layer followed by spacer etch, or surfaces of a previously deposited adhesion layer) are terminated 102 to react with the first phase of the ALD process. The first phases of the preferred embodiments (see Tables I to IV) are reactive, for example, with hydroxyl (OH) or ammonia ($NH_3$) termination. Silicon oxide and silicon nitride surfaces do not require a separate termination. Certain metal surfaces, such as a metal blocking layer or the circuit element at the bottom of the via 61 (FIG. 9a), if exposed, can be terminated, for example, with ammonia treatment. Where the lining material to be deposited is a metal nitride, surface termination can be considered to include formation of a blocking layer and any further adhesion layer (also by ALD), possibly with an additional surface termination treatment of the blocking layer or of the further adhesion layer.

After initial surface termination 102, if necessary, a first chemistry is then supplied 104 to the workpiece. In accordance with the preferred embodiments, discussed in more detail below with respect to FIG. 4, the first chemistry comprises a metal-containing compound that is reactive with the terminated surfaces left by the previous step 102. Accordingly, a metal-containing species replaces or adsorbs upon the surface termination. This metal-containing species layer is desirably self-terminating, such that any excess constituents of the first chemistry do not further react with the monolayer formed by this process. Preferably a halide or organic ligand terminates the metal-containing monolayer.

The metal-containing reactive species is preferably supplied in gaseous form, and is accordingly referred to hereinbelow as a metal source gas. In some examples, the reactive species actually has a melting point above the process temperature (e.g., in Table V below, CuCl melts at 430° C. while the process is conducted at about 350° C.). Nevertheless, the metal source gas is considered "volatile," for purposes of the present description, if the species exhibits sufficient vapor pressure under the process conditions to transport the species to the workpiece in sufficient concentration to saturate exposed surfaces.

The first chemistry is then removed 106 from the reaction chamber. In the illustrated embodiments, step 106 merely entails stopping the flow of the first chemistry while continuing to flow a carrier gas for a sufficient time to diffuse or purge excess reactants and reactant by-products out of the vias, trenches and the reaction chamber, preferably with greater than about two reaction chamber volumes of the purge gas, more preferably with greater than about three chamber volumes. In the illustrated embodiment, the removal 106 comprises continuing to flow purge gas for between about 0.1 seconds and 20 seconds after stopping the flow of the first chemistry. Inter-pulse purging is described in co-pending U.S. patent application having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be completely evacuated between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 104 and reactant removal 106 represent a first phase 107 in an ALD cycle.

When the reactants of the first chemistry have been removed 106 from the chamber, a second chemistry is supplied 108 to the workpiece. The second chemistry desirably reacts with the self-terminated monolayer formed in step 104. In the illustrated embodiments, described in more detail below with respect to FIG. 4, this reaction comprises supplying a nitrogen source gas to the workpiece. Nitrogen or nitrogen-containing species from the nitrogen source gas preferably reacts with the previously adsorbed metal-containing species to leave a metal nitride in place of the metal-containing monolayer.

In other arrangements, the second chemistry may simply scavenge or remove the ligand termination of the adsorbed metal complex monolayer formed in step 104 (e.g., by ligand-exchange, sublimation or reduction) or otherwise prepare the monolayer for deposition/adsorption of a further monolayer and/or reaction with a further chemistry (see, e.g., Tables I, IV and V below). Desirably, the reaction 108 is also self-limiting. Reactants saturate the limited number of reaction sites left by step 104. Temperature and pressure conditions are preferably arranged to avoid diffusion of reactants from the second chemistry through the monolayer to underlying materials. The second chemistry also leaves a surface termination that operates to limit the deposition in a saturative reaction phase. In the illustrated embodiments of Tables II and III below, nitrogen and $NH_x$ tails terminating a metal nitride monolayer are non-reactive with $NH_3$ of the second chemistry.

After a time period sufficient to completely saturate and react the metal-containing monolayer with the second chemistry, the second chemistry is removed 110 from the workpiece. As with the removal 106 of the first chemistry, this step 110 preferably comprises stopping the flow of the second chemistry and continuing to flow carrier gas for a time period sufficient for excess reactants and reaction by-products from the second chemistry to diffuse out of the vias and trenches of the damascene structure and be purged from the reaction chamber. For example, reactants and reaction by-products can be removed by flowing purge gas after stopping the flow of the second chemistry, preferably with at least about two chamber volumes of purge gas and more preferably with at least about three chamber volumes. In the illustrated embodiment, the removal 110 comprises continuing to flow purge gas for between about 0.1 seconds and 20 seconds after stopping the flow of the second chemistry. Together, the reaction 108 and removal 110 represent a second phase 111 in an ALD cycle.

In the illustrated embodiment, where two phases are alternated once the excess reactants and by-products of the second chemistry have diffused out of the vias and trenches, and preferably out of the reaction chamber, the first phase 107 of the ALD process is repeated. Accordingly, again supplying 104 the first chemistry to the workpiece forms another self-terminating monolayer.

The two phases 107, 111 thus represent a cycle 115 repeated to form monolayers in an ALD process. The first chemistry generally reacts with the termination left by the second chemistry in the previous cycle. If necessary, the cycle 115 can be extended to include a distinct surface preparation, similar to step 102, as shown in dotted lines in FIG. 3. The cycle 115 then continues through steps 104 to 110. This cycle 115 is repeated a sufficient number of times to produce a lining layer within the dual damascene structure of a thickness sufficient to perform its desired function.

Though illustrated in FIG. 3 with only first and second chemistries, it will be understood, that, in other arrangements, additional chemistries can also be included in each cycle (see, e.g., Table IV below). Furthermore, though illustrated with an initial metal phase and subsequent nitrogen phase in the examples below, it will be understood that the cycle can begin with the nitrogen phase, depending upon the surfaces and phase chemistries.

Blocking Pores Prior to ALD Processes

As noted with respect to FIG. 3, the structure including openings (e.g., the via 62 and trench 60) in the porous low k layers 50, 56 is blocked or sealed at the exposed surfaces of the low k material, particularly those surfaces subject to open pores. The method is selected to block, plug or seal the pores of the porous low k material at the exposed surfaces, without filling the pores to any significant depth into the low k material. Completely filling the pores of the low k material, even with an insulating material, would negate the advantage of the porous low k material by raising the dielectric constant of the material. In the case of blocking with conductive material, significant penetration into the low k material risks forming short circuits through the layers 50, 56. In one embodiment, discussed below with respect to FIG. 21, sealing can be accomplished by reforming a surface of interest, such as, e.g., melting or otherwise treating the surface to collapse or otherwise seal off pore openings at the surface.

Figure 10A:
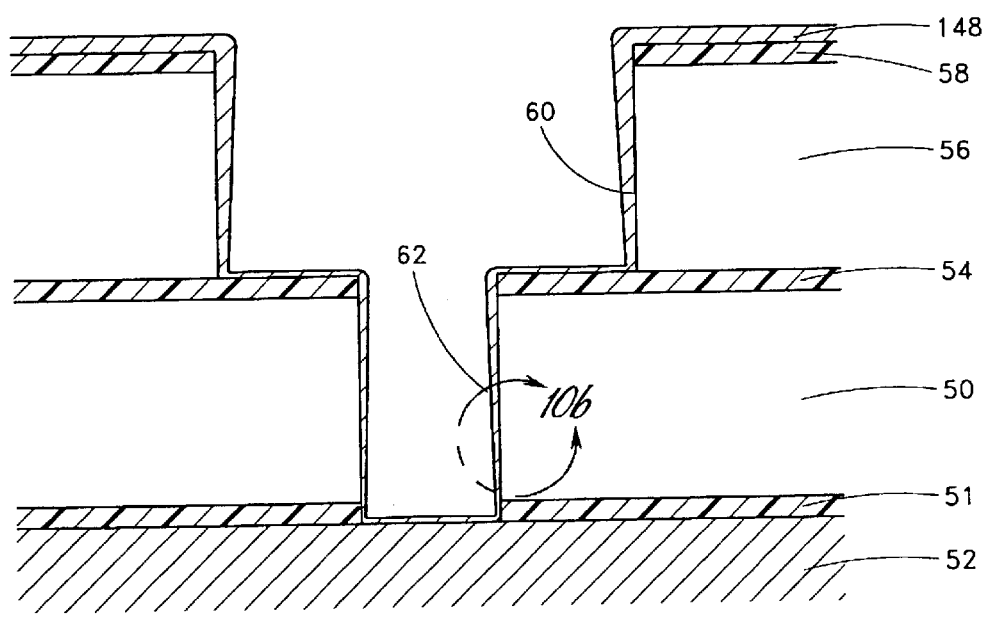
FIG. 10a shows the dual damascene structure of FIG. 9a after the trench 60 and via 62 have been lined with a sealing layer 148.

In the illustrated embodiment, blocking is accomplished by lining the opening in the porous low k layers 50, 56 with a sealing layer 148 as shown in FIG. 10a. More particularly, the sealing layer 148 is deposited by a method that does not have high enough conformality to extensively fill the pores through the thickness of the low k insulators 50, 56. Preferably, the deposition fills or plugs pores no more than three pore depths into the low k insulator, where the pore depth is defined by average pore size. More preferably, the deposition fails to continuously line pores beyond three pore depths into the low k insulator. Most preferably, the deposition fills pores no more than one pore depth into the low k material, continuously lines pores no more than two pore depths into the low k material, and insufficiently lines pores three pore depths into the layer to conduct electricity if the deposited material were conductive.

Figure 10B:
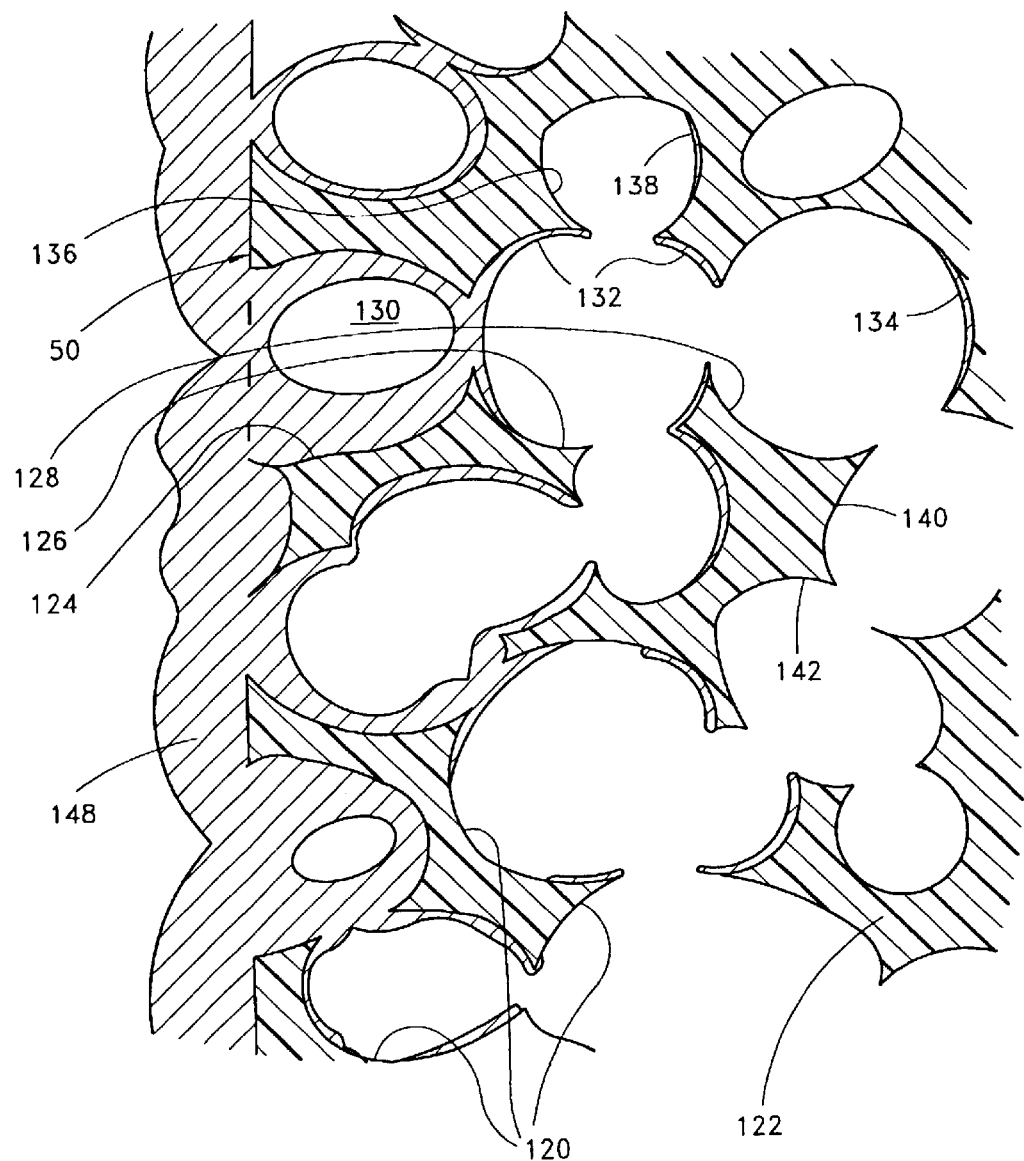
FIG. 10b is an enlarged view of the via sidewall shown in cross-section, illustrating that the low k material 50 comprises a plurality of pores 120 with in a matrix 122 of insulating material.

With reference to FIG. 10b, an enlarged view of the via sidewall is shown in cross-section. In accordance with the illustrated embodiment, the low k material 50 comprises a plurality of pores 120 within a matrix 122 of insulating material. The illustrated low k material 50, comprising Nanoglass™, commerically available from Honeywell Advanced Microelectronic Materials (AMM) of Sunnyvale, Calif. (formerly Allied Signal), has a porosity of about 70% with an average pore size of about 4 nm to achieve a k value of about 2.0. Accordingly, the pores 120 are interconnected, as shown.

For purposes of illustration, three consecutive pores are shown with about the average pore size, though the skilled artisan will readily appreciate that the pore size will deviate randomly from the average pore size and that the pore orientations relative to one another will also be random. One pore depth, as defined herein, refers to the distance of the average pore size. In the illustrated artificial example, a first pore 124 extending from the via surface represents the first pore depth, a second pore 126 represents the second pore depth, and a third pore 128 represents the third pore depth.

As shown in FIG. 10b, none of the pores are completely filled. The first pore 124, open to the via 62 (FIG. 10a), is largely filled with the material of the sealing layer 148. Due to imperfect conformality, however, the sealing layer 148 has pinched off the opening to the first pore 124 before complete filling, leaving a void 130 within the first pore 124. The second pore 126 is shown with a very thin coating 132 of the pore walls that can in some instances be continuous. The third pore 128 has only non-continuous deposits 134, if any. Similarly, a fourth pore 136, which also represents the third pore depth in terms of distance through the pores from the outer (via) surface of the low k material, has only non-continuous deposits, if any. In the illustrated embodiment, a fourth pore 140 and a fifth pore 142, both representing the fourth pore depth from the surface (along different paths), have no appreciable deposits.

If, as preferred, the sealing layer 148 comprises a conductive material, current can conduct only as far as the second pore depth, in the illustrated embodiment. While the discontinuous coatings 138, 134 raise some risk of arcing, the risk is minimal and inconsequential for most circuit designs. The skilled artisan will appreciate that some process flows and circuit designs will have very different tolerances (broader or narrower than that illustrated) for the amount of diffusion through the pores that is acceptable. Moreover, regardless of the amount of diffusion allowed during formation of the sealing layer 148, blocking the pores will be advantageous in avoiding far more extensive diffusion during subsequent conformal ALD processes.

In accordance with one embodiment, the sealing layer 148 can comprise an insulating material such as silicon dioxide formed by conventional CVD processes. In this case, deposition of the sealing layer is followed by a selective etch to remove the insulating material from the floor of the via 62 and thereby expose the underlying conductive element. An exemplary selective etch comprises a reactive ion etch, selectively removing horizontal surfaces from the workpiece and tending to straighten the inwardly sloped sidewalls left by the CVD process.

In accordance with the illustrated embodiment, however, the sealing layer 148 comprises a conductive material that does not need to be removed prior to filling the via 62 with a contact plug. Conventional CVD of metal, such as tungsten, titanium, etc., can advantageously serve as both a conductive adhesion layer and the sealing layer 148. If sufficiently conductive, the sealing layer 148 can then remain over all interior surfaces of the opening as a part of the final structure (see FIG. 13).

Either conductive or insulating sealing layers can also be deposited by PVD (e.g., sputtering or evaporation). Advantageously, PVD typically exhibits lower conformality than CVD and so will likely pinch off the pores more quickly than CVD. This advantage needs to be balanced against the poorer step coverage of the dual damascene structure afforded by PVD.

Whether CVD or PVD, conditions for the deposition should be carefully arranged to balance a need for relatively high conformality, to reach the bottom of the via 62 (FIG. 10a), with a need for relatively low conformality, to pinch off the pores prior to significant penetration of the sealing layer material though the porous low k material. The skilled artisan can readily optimize deposition conditions, in view of the present disclosure, as a matter of routine experimentation.

In another embodiment, the sealing or blocking layer 148 can be formed by an alternating process (using pulses similar to ALD) optimized to block the pores of the low k layers 50, 56 before significant penetration into the layers. Previous work has been conducted to determine the conditions under which porous materials can be coated by ALD. See A. W. Ott., J. W. Klaus, J. M. Johnson, S. M. George, K. C. McCarley, J. D. Way, "Modification of Porous Alumina Membranes Using $Al_2O_3$ Atomic Layer Controlled Deposition," *Chem. Mater.* Vol. 9, No. 3 (1997), p. 707–714; and Suvi Haukka, Eeva-Liisa Lakomaa, Tuomo Suntola, "Chemisorption of chromium acetylacetonate on porous high surface area silica," *Appl. Surf. Sci.* Vol. 75, No. 1–4 (1994), pp. 220–227. The articles noted above are hereby expressly incorporated herein by reference. The skilled artisan will appreciate in view of the present disclosure that, conversely, the conditions for avoiding conformal coating of a porous material can be determined using similar techniques. Advantageously, a "low conformality" alternating process for blocking the pores of the low k material can be followed in situ by high conformality ALD layers, having a minimal, uniform thickness to accomplish the goals of the layers (e.g., adhesion, barrier, electroplating seed layer), thus conserving space for more conductive materials to fill the opening.

In one embodiment, the reactants are pulsed into the reaction chamber in an inert carrier gas, similar in sequence to the process described above for ALD. In the first pulse of metal source gas, the surface of the substrate is lined with the metal-containing species. In addition, the metal source gas is able to penetrate into the porous insulating layer by diffusion. If necessary, the first pulse can be lengthened as compared to a subsequent ALD process, ensuring penetration of the metal source gas into the porous insulating layer.

Following the first pulse, the metal source gas is purged from the reaction chamber with a pulse of inert gas. In this embodiment of the invention, the purge is insufficient to remove all of the metal source gas from the pores and some remains trapped in the pores of the insulating material. The duration of the purge pulse may be equivalent to that of an ALD process that is optimized to purge reactants from the trenches and vias, but not optimized to purge out the pores. Alternately, the purge pulse may be shortened to ensure that metal source gas remains within the pores of the insulating material.

A second chemistry is pulsed into the chamber following the purge. Preferably the second chemistry is a nitrogen source gas. The second chemistry reacts with the monolayer of metal-containing species adsorbed on the surface of the via. Additionally, the second chemistry diffuses into the insulating material where it reacts with the metal source gas that remains within the pores. This is a CVD-type reaction, leading to deposition of much more than one monolayer of metal within the pores. The second chemistry will react with the first metal source gas it encounters and thus its diffusion into the pores will be limited, leading to a depletion effect into the insulating layer. The result of the depletion effect will be the deposition of the most metal at the neck of the first pore, with metal deposition decreasing with distance into the insulating material. This will narrow the neck of the first pore, further limiting diffusion into the porous insulating material during subsequent ALD cycles. Thus, the alternating process operates in an ALD mode in relatively accessible regions, and in a CVD mode with attending depletion effects in relatively more confined regions, such as the pores. From FIGS. 10a and 10b, it will be clear that top surface regions of the substrate are the most accessible regions, a trench or via region has a reduced accessibility, the accessibility decreasing with increasing distance to the top surface, and pore regions have the lowest accessibility. The process can be more generally applied whenever such differences in accessibility exist. Another example is provided below with respect to FIG. 22.

Repetition of the ALD cycle will narrow the neck of the first pore further by increasing the thickness of the deposited layer and will eventually lead to a continuous, sealing layer blocking off the pores. The combination of the CVD depletion effect and the resulting decrease in diffusion into the pores, will allow this process to seal the porous insulating material without reducing the insulating properties of the material. The number of repetitions needed to seal off the pores will depend on the pore size and can be determined by the skilled artisan through routine experimentation. This method avoids the poor conformality CVD or PVD provide on the trench and via surfaces yet still provides a conductive sealing layer on which to build a metal adhesion layer or barrier diffusion layer.

As will be appreciated by the skilled artisan in view of the above disclosure, this alternating deposition process can be optimized, by proper selection of reactant pulse duration and separation (e.g., purge step duration) for a desired level of conformality. This "low conformality" modification advantageously achieves a conformality along a continuum between the near perfectly conformal coverage of a pure ALD process (wherein reactant pulses are self-saturating and well separated from one another to avoid CVD reactions) and the relatively poor conformality of a pure CVD process (wherein deposition rates are strongly influenced by temperature and/or reactant concentration). Advantageously, the skilled artisan can readily tailor the conformality suitable for a given geometry and a given purpose for a nonconformal layer through routine experimentation with varied reactant pulse durations and separations. It will be appreciated, in view of the disclosure herein, that selection of pulse durations and separations can involve one or more of the deposition phases in each cycle, and that each cycle can include two, three or more reactant pulses. Further examples are given below with respect to FIG. 22 below.

In the further lining processes of the preferred embodiments, discussed below, very high conformality of ALD risks completely coating the pores of the low k dielectric with a conductive material. This coating could conduct current through the insulator, short circuiting runners and/or devices. The sealing layer 148 (FIG. 10*a*), however, blocks the pores and prevents entry of reactants after the pores have been blocked, particularly before any high conformality ALD process begins. This is particularly significant for the metal and metal nitride deposition chemistries set forth in the tables below.

Forming Metal Adhesion Liners

Depending upon the exposed materials and desired ALD chemistry, an adhesion layer prior to formation of a barrier diffusion layer may or may not be desired. With TEOS oxides, the inventors have not found the use of an adhesion layer necessary. On the other hand, adhesion layers may be desirable for vias and trenches formed in the preferred spin-on and other low k insulating materials. Conductive adhesion layers may also be desirable to facilitate reaction of the first phase over metal runners or landing pads 52 exposed at the bottom of the via 61 (FIG. 9*a*).

Most preferably, the sealing layer 148 (FIG. 10*b*) comprises a metal layer and serves also as an adhesion layer. Accordingly, in the preferred embodiment, no further adhesion layer is required.

If an adhesion layer is desired, the adhesion layer preferably comprises a "pure" metal lining layer over oxide, metal and etch stop layers of the dual damascene structures. Prior to forming the preferred barrier layers, therefore, a dual damascene structure similar to those of FIGS. 9*a* to 9*e* is preferably lined with a metal adhesion layer after or simultaneously with forming the sealing layer 148 (FIG. 10*a*). As is known in the art, such adhesion layers can be formed by PVD or CVD. For example, PVD titanium and CVD tungsten processes are well known in the art. Advantageously, such adhesion layers deposited by conventional processes will also serve as the initial protective or blocking layer, as set forth above.

It is conceivable that, in other arrangements, the pores of the low k dielectrics can be effectively blocked or plugged without full coverage of the via and trench surfaces (see, e.g., FIG. 22 and accompanying description below). In this case, a further adhesion layer is desirably formed by ALD to provide a minimal thickness with maximum conformality, as exemplified by the process recipe of Table I below. It will be understood that the principles disclosed herein with respect to FIG. 3, and with respect to the particular examples of metal nitrides set forth below, are applicable to the formation of a variety of liner materials. For example, a pure metal layer can be deposited by alternately depositing halogen- or organic-terminated monolayers of metal and flowing reduction agents (e.g., H radicals, triethyl boron or other strong reducers) to remove the halogen termination. Removal of the metal monolayer termination by binding and carrying the ligand away can be more generally referred to as "gettering" or "scavenging" the ligand. In the next cycle, therefore, the metal source gas can adsorb upon the underlying metal monolayer in another self-terminating phase. The resultant ALD metal is particularly useful as an adhesion layer prior to barrier layer deposition, and as a seed layer following barrier deposition and preceding electroplating.

Accordingly, one of the reactant species preferably includes a metal-containing species with an organic or halide ligand. Exemplary metal precursors include tantalum pentaethoxide, tetrakis(dimethylamino)titanium, pentakis (dimethylamino)tantalum, $TaCl_5$ and $TiCl_4$. In the illustrated embodiment, a tungsten (W) seed layer is formed by ALD, in alternating metal and reducing phases separated by purge steps. In the process recipe of Table I below, tungsten hexafluoride ($WF_6$) is alternated with a scavenger in the form of the reducing agent triethyl boron ($(CH_3CH_2)_3B$) or TEB.

TABLE I

| Phase | Carrier Flow (slm) | Reactant | Reactant Flow (sccm) | Temperature (° C.) | Pressure (Torr) | Time (sec) |
| --- | --- | --- | --- | --- | --- | --- |
| metal | 600 | $WF_6$ | 50 | 400 | 10 | 0.25 |
| purge | 600 | — | — | 400 | 10 | 0.5 |
| reduce | 600 | TEB | 40 | 400 | 10 | 0.1 |
| purge | 600 | — | — | 400 | 10 | 0.8 |

Radicals provided by plasma generators can facilitate deposition of metal-containing layers at the low temperatures of ALD processing. Structures and methods of depositing metals and metal-containing layers with radical enhancement are provided in patent application having Ser. No. 09/392,371, filed Sep. 8, 1999 and entitled IMPROVED APPARATUS AND METHOD FOR GROWTH OF A THIN FILM, the disclosure of which is incorporated by reference hereinabove. Another exemplary ALD metal process flow is provided in U.S. Pat. No. 5,916,365 to Sherman, issued Jun. 29, 1999, the disclosure of which is incorporated herein by reference.

Methods of Forming Metal Nitride Barrier Liners

Figure 4:
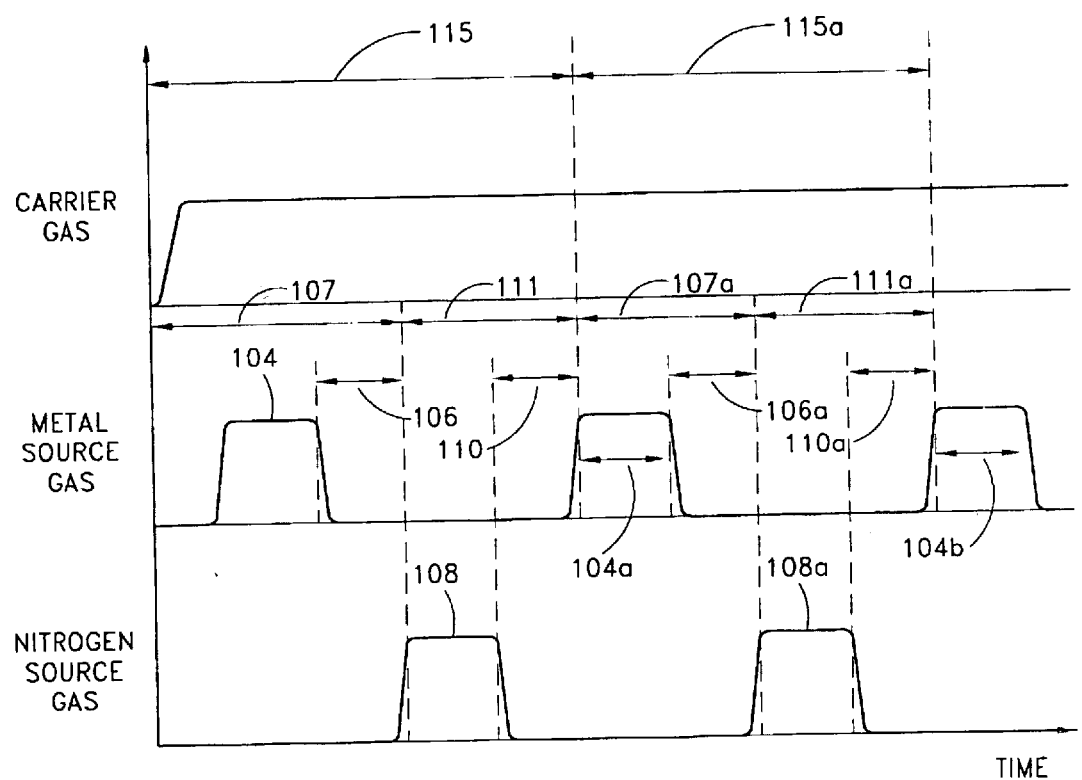
FIG. 4 is an exemplary gas flow diagram for depositing a barrier layer, in accordance with a preferred embodiment of the present invention.

FIG. 4 and Tables II to IV below illustrate exemplary processes for forming metal nitride barrier layers lining the structures of FIGS. 9A to 9E. For simplicity, like reference numerals are employed to refer to the phases and steps of the metal nitride examples (FIG. 4) that correspond to the general description of FIG. 3.

With reference now to FIG. 4, a gas flow sequence is represented in accordance with a particular embodiment. In the illustrated example, a conductive nitride, and more particularly a metal nitride, is formed by supplying the workpiece with a metal source gas alternately with a nitrogen source gas. The first or metal phase 107 of each cycle chemisorbs a layer of metal-containing material, desirably in the absence of the nitrogen source gas. The second or nitrogen phase 111 of each cycle reacts or adsorbs a nitrogen-containing material on the deposited metal-containing layer, desirably in the absence of the metal source gas. It will be understood that, in other arrangements, the order of the phases can be reversed, and that the reactant removal or purge steps can be considered part of the preceding or subsequent reactant pulse.

Surfaces of the damascene structure upon which the lining material is to be formed are initially terminated to provide a surface that is reactive with the metal source gas. In the embodiment of FIG. 10a, the exposed surfaces upon which deposition is desired are provided by the sealing layer 148. The preferred metal layer can be terminated, for example, with $NH_3$ to facilitate chemisorption of the reactant pulses discussed below.

Most preferably, the metal phase 107 is self-limiting, such that no more than about one atomic monolayer is deposited during the first phase. Desirably, a volatile metal source gas is provided in a pulse 104. Exemplary metal source gases include titanium tetrachloride ($TiCl_4$), tungsten hexafluoride ($WF_6$), tantalum pentachloride ($TaCl_5$), tantalum pentaethoxide, tetrakis(dimethylamino)titanium, pentakis(dimethylamino)tantalum, copper chloride (CuCl) and copper hexafluoroacetylacetonate vinyltrimethylsilane (Cu(HFAC)VTMS).

After a sufficient time for the metal source gas to diffuse into the bottom of the dual damascene contact via, shutting off the flow of the metal source gas ends the metal pulse 104. Preferably, carrier gas continues to flow in a purge step 106 until the metal source gas is purged from the chamber.

During the pulse 104, the metal source gas reacts with exposed and terminated surfaces of the workpiece to deposit or chemisorb a "monolayer" of metal-containing species. While theoretically the reactants will chemisorb at each available site on the exposed layer of the workpiece, physical size of the adsorbed species (particularly with terminating ligands) will generally limit coverage with each cycle to a fraction of a monolayer. In the example of Table II, the ALD process grows metal nitride layers at roughly 0.35 Å/cycle, such that a full monolayer effectively forms from material deposited approximately every 15 cycles for TiN, which has a bulk lattice parameter of about 4.2 Å. Each cycle 115, 115a is represented by a pair of metal source gas and nitrogen source gas pulses. "Monolayer," as used herein, therefore refers to a fraction of a monolayer during deposition, referring primarily to the self-limiting effect of the pulse 104.

In particular, the metal-containing species deposited/adsorbed upon the workpiece is self-terminating such that the surface will not further react with the metal source gas. In the examples set forth below, $TiCl_4$ (Table II) leaves a monolayer of chloride-terminated titanium. $WF_6$ (Tables III and IV) leaves a monolayer of fluorine-terminated tungsten. Similarly, other volatile metal halides will leave halide-terminated surfaces, and metal organics, such as tantalum pentaethoxide, tetrakis(dimethylamino)titanium, and pentakis(dimethylamino)tantalum, will leave surface terminated with organic ligands. Such surfaces do not further react with the metal source or other constituents of the reactant flow during the metal source gas pulse 104. Because excess exposure to the reactants does not result in excess deposition, the chemistry during the metal phase 107 of the process is said to be self-limiting or self-saturating. Despite longer exposure to a greater concentration of reactants, deposition over upper surfaces of the workpiece does not exceed deposition over the via floor.

In a second phase 111 of the cycle 115, a pulse 108 of a nitrogen source gas is then provided to the workpiece. In the illustrated examples, the nitrogen source gas comprises ammonia. Preferably, the second phase 111 is maintained for sufficient time to fully expose the monolayer of metal-containing species left by the first phase 107 to the nitrogen source gas. After a sufficient time for the nitrogen source gas to diffuse into the bottom of the dual damascene contact via, shutting off the flow of the metal source gas ends the nitrogen pulse 108. Preferably, carrier gas continues to flow in a purge step 110 until the nitrogen source gas is purged from the chamber.

During the nitrogen pulse 108, the nitrogen source gas reacts with or chemisorbs upon the self-terminated metal monolayer left by the first phase 107. In the embodiments of Tables II and III, this chemisorption comprises a saturative ligand-exchange reaction, replacing the halogen termination of the metal monolayer with a nitrogen-containing species. In the embodiment of Table IV, in contrast, an intermediate getter or scavenging phase first removes the halogen termination of the metal monolayer prior to a nitrogen pulse. In this case, in a third phase the nitrogen-containing species reacts with or adsorbs upon the metal left exposed by the getter phase. In either case, a metal nitride is thereby formed, preferably in a single monolayer. Desirably, the process leaves a stoichiometric metal nitride. As discussed with respect to the metal phase 107, the monolayer need not occupy all available sites, due the physical size of the adsorbed species. However, the second phase 111 also has a self-limiting effect.

In particular, the nitrogen source gas reacts with the metal-containing species chemisorbed onto the workpiece surface during the previous pulse of metal source gas. The reaction is also surface terminated, since ammonia during the pulse 108 will not react with nitrogen and $NH_x$ tails terminating the metal nitride monolayer. Moreover, temperature and pressure conditions are arranged to avoid diffusion of ammonia through the metal monolayer to underlying materials. Despite longer exposure to a greater concentration of reactants in this saturative, self-limiting reaction phase 111, the thickness of the metal nitride formed on upper surfaces of the workpiece does not exceed the thickness of the metal nitride formed on the via floor.

The metal phase 107 (including metal source pulse 104 and purge 106) and nitrogen phase 108 (including nitrogen source pulse 108 and purge 110) together define a cycle 115 that is repeated in an ALD process. After the initial cycle 115, a second cycle 115a is conducted, wherein a metal source gas pulse 104a is again supplied. The metal source gas chemisorbs a metal-containing species on the surface of the metal nitride formed in the previous cycle 115. The metal-containing species readily react with the exposed surface, depositing another monolayer or fraction of a monolayer of metal-containing species and again leaving a self-terminated surface that does not further react with the metal source gas. Metal source gas flow 104a is stopped and purged 106a from the chamber, and (according to Tables II and III) a second phase 111a of the second cycle 115a provides nitrogen source gas to nitridize the second metal monolayer. According to the example of Table IV, the nitrogen phase is preceded by an intermediate getter or scavenging phase.

The cycle 115a is repeated at least about 10 times, and more preferably at least about 20 times, until a sufficiently thick metal nitride is formed to serve a barrier function in the dual damascene structure. Advantageously, layers having a thickness of less than about 200 Å, and more preferably less than about 100 Å, can be formed with near perfect step coverage by the methods of the preferred embodiments.

EXAMPLES

The tables below provide exemplary process recipes for forming metal nitride layers suitable for barrier applications in dual damascene metallization schemes for ultra large scale integrated processing. Each of the process recipes represents one cycle in a single-wafer process module. In particular, the illustrated parameters were developed for use in the single-wafer ALD module commercially available under the trade name Pulsar 2000™ from ASM Microchemistry Ltd. of Espoo, Finland.

Note that the parameters in the tables below (and also in Table I above) are exemplary only. Each process phase is desirably arranged to saturate the via and trench surfaces, and more particularly to saturate sealing layer 148 (FIG. 10a) formed to a minimum thickness over the via and trench surfaces. Purge steps are arranged to remove reactants between reactive phases from the vias. The examples herein have been conducted upon planar, unpatterned wafer surfaces in a Pulsar 2000™ reaction chamber, from ASM Microchemistry Ltd. of Finland. Similar ALD processes have been determined to achieve better than 90% step coverage in voids with aspect ratios of greater than about 20. In view of the disclosure herein, the skilled artisan can readily modify, substitute or otherwise alter deposition conditions for different reaction chambers and for different selected conditions to achieve saturated, self-terminating phases at acceptable deposition rates. Due to the previous sealing layer 148, however, this high conformality ALD process does not reach the pores, which remain largely void and free of conductive coatings.

Advantageously, the ALD processes described herein are relatively insensitive to pressure and reactant concentration, as long as the reactant supply is sufficient to saturate the trench and via surfaces. Furthermore, the processes can operate at low temperatures. Workpiece temperature is preferably maintained throughout the process between about 300° C. and 500° C. to achieve relatively fast deposition rates while conserving thermal budgets during the back-end process. More preferably, the temperature is maintained between about 350° C. and 400° C., and most preferably between about 380° C. and 400° C. Pressure in the chamber can range from the milliTorr range to super-atmospheric, but is preferably maintained between about 1 Torr and 500 Torr, more preferably between about 10 Torr and 100 Torr.

In the first phase of the first cycle, $TiCl_4$ chemisorbs upon the exposed surfaces of the dual damascene trenches and contact vias, particularly upon the sealing layer 148 formed to block pores in the low k material. The metal source gas preferably comprises a sufficient percentage of the carrier flow, given the other process parameters, to saturate the damascene surfaces. A monolayer of titanium complex is left upon the trench and via surfaces, and this monolayer is self-terminated with chloride.

Desirably, the reactor includes a catalyst to convert the metal source gas to a smaller and/or more reactive species. In the illustrated embodiment, the preferred reaction chamber comprises titanium walls, which advantageously convert $TiCl_4$ to $TiCl_3$. The smaller species readily diffuse into vias, occupy more reactive sites per cycle and more readily chemisorb onto the active sites. Accordingly, the catalyst enables faster deposition rates. The skilled artisan will readily appreciate that other catalysts can be employed for other chemistries.

After the $TiCl_4$ flow is stopped and purged by continued flow of carrier gas, a pulse of $NH_3$ is supplied to the workpiece. Ammonia preferably comprises a sufficient percentage of the carrier flow, given the other process parameters, to saturate the surface of the metal-containing monolayer. The $NH_3$ readily reacts with the chloride-terminated surface of the metal monolayer in a ligand-exchange reaction, forming a monolayer of titanium nitride (TiN). The reaction is limited by the number of available metal chloride complexes previously chemisorbed. Neither ammonia nor the carrier gas further reacts with the resulting titanium nitride monolayer, and the monolayer is left with a nitrogen and $NH_x$ bridge termination. The preferred temperature and pressure parameters, moreover, inhibit diffusion of ammonia through the metal monolayer.

In the next cycle, the first phase introduces $TiCl_4$, which readily reacts with the surface of the titanium nitride monolayer, again leaving a chloride-terminated titanium layer. The second phase of the second cycle is then as described with respect to the first cycle. These cycles are repeated until the desired thickness of titanium nitride is formed.

In the illustrated embodiment, carrier gas continues to flow at a constant rate during both phases of each cycle. It will be understood, however, that reactants can be removed by evacuation of the chamber between alternating gas pulses. In one arrangement, the preferred reactor incorporates hardware and software to maintain a constant pressure during the pulsed deposition. The disclosures of U.S. Pat. No. 4,747,367, issued May 31, 1988 to Posa and U.S. Pat. No. 4,761,269, issued Aug. 2, 1988 to Conger et al., are incorporated herein by reference.

TABLE II

| Phase | Carrier Flow (slm) | Reactant | Reactant Flow (sccm) | Temperature (° C.) | Pressure (Torr) | Time (sec) |
|---|---|---|---|---|---|---|
| metal | 400 | $TiCl_4$ | 20 | 400 | 10 | .05 |
| purge | 400 | — | — | 400 | 10 | 0.8 |
| nitrogen | 400 | $NH_3$ | 100 | 400 | 10 | 0.75 |
| purge | 400 | — | — | 400 | 10 | 1.0 |

Table II above presents parameters for ALD of a titanium nitride (TiN) barrier into trenches and contact vias of a dual damascene structure. As noted, the metal source gas comprises titanium tetrachloride ($TiCl_4$), the carrier gas comprises nitrogen ($N_2$) and the nitrogen source gas preferably comprises ammonia ($NH_3$).

TABLE III

| Phase | Carrier Flow (slm) | Reactant | Reactant Flow (sccm) | Temperature (° C.) | Pressure (Torr) | Time (sec) |
|---|---|---|---|---|---|---|
| metal | 600 | $WF_6$ | 50 | 400 | 10 | 0.25 |
| purge | 600 | — | — | 400 | 10 | 0.25 |
| nitrogen | 600 | $NH_3$ | 100 | 400 | 10 | 0.5 |
| purge | 600 | — | — | 400 | 10 | 1.0 |

Table III above presents parameters for ALD of tungsten nitride (WN). As noted, the metal source comprises tungsten hexafluoride ($WF_6$), the carrier gas comprises nitrogen ($N_2$) and the nitrogen source gas preferably comprises ammonia ($NH_3$). During each of the reaction phases, the reactants are supplied in sufficient quantity for the given other parameters to saturate the surface.

In this case, the metal monolayer formed in the metal phase is self-terminated with fluoride, which does not readily react with $WF_6$ under the preferred conditions. The preferred nitrogen source gas, however, reacts with or adsorbs upon the fluoride-terminated surface during the nitrogen phase in a reaction limited by the limited supply of tungsten fluoride complexes previously adsorbed. Moreover, nitridation leaves a nitrogen and $NH_x$ termination that does not further react with excess ammonia in the saturative phase.

TABLE IV

| Phase | Carrier Flow (slm) | Reactant | Reactant Flow (sccm) | Temperature (° C.) | Pressure (Torr) | Time (sec) |
|---|---|---|---|---|---|---|
| metal | 400 | $WF_6$ | 50 | 400 | 10 | 0.25 |
| purge | 400 | — | — | 400 | 10 | 0.8 |
| reduce | 400 | TEB | 50 | 400 | 10 | 0.01 |
| purge | 400 | — | — | 400 | 10 | 0.5 |
| nitrogen | 400 | $NH_3$ | 100 | 400 | 10 | 0.25 |
| purge | 400 | — | — | 400 | 10 | 0.5 |

Table IV above presents parameters for another ALD process for forming tungsten nitride (WN). The illustrated embodiment is particularly advantageous for directly depositing a barrier layer upon metal. In the illustrated embodiment, the metal of the preferred sealing layer 148 (FIG. 10*a*) is exposed. In other arrangements, metal can be exposed at the via floor and insulating surfaces of the trench and via, without an intermediate adhesion layer. As noted, the metal source comprises tungsten hexafluoride ($WF_6$), the carrier gas comprises nitrogen ($N_2$) and the nitrogen source gas preferably comprises ammonia ($NH_3$). In this case, a getter or scavenger removes the ligands left by the metal phase. In particular, a strong reducer, comprising TEB (triethyl boron) in the illustrated embodiment, reduces or otherwise removes the halogen-terminated metal complex monolayer. The nitrogen source gas then readily reacts with the reduced metal surface. In other arrangements, the getter can replace the halogen-termination in a ligand-exchange reaction, desirably leaving a surface reactive with a subsequent nitrogen-containing species. The nitrogen phase saturates the reaction sites left by the getter phase (i.e., the exposed tungsten surface in the illustrated embodiment) and leaves a nitrogen and $NH_x$ termination that does not further react with excess ammonia in the saturative phase.

The intermediate reduction phase results in a metal nitride crystallinity that exhibits lower resistivity than films formed by the ligand-exchange reaction of Table III. Such lowered resistivity is advantageous for the preferred dual damascene barrier context, where the barrier is placed in the conductive path of integrated circuit wires.

Moreover, the intermediate scavenger, as represented by the TEB pulse of Table IV, binds and carries away the halide tails left by the previous metal phase prior to introduction of the ammonia phase. Advantageously, the ammonia phase reacts directly with metal formed in the first phase, rather than liberating hydrogen halides (e.g., HF) in a ligand-exchange reaction. In contrast to HF, the complex produced by binding halides to the getter or scavenger does not corrode sensitive surfaces such as the metal at the bottom of the damascene structure. Accordingly, the metal line 52 or the preferred metal sealing layer 148 (FIG. 10*a*) of the dual damascene structure is protected from corrosive effects of HF or other halide species. The process of Table IV has been found particularly advantageous where, as in the preferred embodiment, the underlying metal comprises copper. Etching of the copper is minimized and uniformity of the blanket metal nitride deposition is thereby improved. The process can be advantageous in a variety of contexts, however, for avoiding the build up of hydrogen halides due to their corrosive effects in general, and particularly due to their tendency to counter the ALD advantage of complete uniformity.

Once an initial, thin layer (e.g., about 3–10 nm) of metal nitride (e.g., WN) is formed by the method of Table IV, further deposition of barrier and/or adhesion materials can proceed without the intermediate scavenger phase. Two-phase cycles employing ligand-exchange reactions can more efficiently produce a thicker barrier layer over the initial layer. For example, WN by the method of Table IV can be followed by further deposition of TiN, such as by the method of Table II. The upper TiN surface of a WN/TiN barrier demonstrates better compatibility with some process flows.

Methods of Forming Metal Seed Layers

After formation of the metal nitride barrier layer, a seed layer may be desirable, depending upon the method to be employed for filling the dual damascene structure and the conductivity of the deposited barrier layer. In the illustrated embodiment, a copper filler is desirably electroplated over the illustrated metal nitride barriers. Accordingly, a highly conductive seed layer is preferably first formed over the barrier layer.

As is known in the art, the seed layer preferably comprises a metal layer, more preferably copper, and can be deposited by any of a number of processes. For example, state-of-the-art processing employs PVD or sputtering to form a copper seed layer. In conjunction with high step coverage obtained in forming the prior metal nitride barrier layer by ALD, such methods may be adequate for many dual damascene schemes.

More preferably, a CVD process is employed to deposit the seed layer with higher step coverage. Metal organic CVD (MOCVD) techniques are disclosed, for example, by Wolf et al., "Process and equipment simulation of copper chemical vapor deposition using Cu(HFAC)VTMS," Microelectronic Engineering, Vol. 45, No. 1, pp.15–27 (February 1999), the disclosure of which is incorporated herein by reference.

Most preferably, the seed layer is also formed by ALD. The volume saved by high step coverage formation of one or more of the adhesion, barrier and seed layers thus contributes to a higher-conductivity line due to a greater volume available for the more conductive filler metal and increased chance of completely filling the contact vias and trenches. Forming the sealing layer by an alternating process, furthermore, effectively lines the via and trench surfaces by ALD while blocking the pores with CVD reactions.

TABLE V

| Phase | Carrier Flow (slm) | Reactant | Reactant Flow (sccm) | Temperature (° C.) | Pressure (Torr) | Time (sec) |
|---|---|---|---|---|---|---|
| metal | 400 | CuCl | 4 | 350 | 10 | 0.2 |
| purge | 400 | — | — | 350 | 10 | 0.5 |
| reduce | 400 | TEB | 40 | 350 | 10 | 0.2 |
| purge | 400 | — | — | 350 | 10 | 0.5 |

Table V above illustrates an ALD pure metal process, similar to that of Table I above. In alternating phases, copper chloride is first adsorbed and then reduced by TEB. Advantageously, copper chloride is a smaller reactive species compared to organic copper species, facilitating rapid and more complete saturation of reactive sites on the workpiece.

Resultant Trench and Via Liners

Referring now to FIG. 10a, the dual damascene structure of FIG. 9a is illustrated with a blocking or sealing layer 148 over at least the sidewalls of the via 62 and trench 60. The sealing layer 148 thus blocks the pores of the porous low k first insulating layer 50 and second insulating layer 56. As discussed above, the sealing layer 148 is preferably formed to the minimum thickness necessary for blocking the pores on the sidewalls prior to forming further lining layers by ALD. The sealing layer may be formed by CVD, PVD, or an alternating process that operates in a CVD mode within the pores, as described above.

In the illustrated embodiment, where the sealing layer 148 is formed by conventional deposition processes, such as CVD and PVD, the minimum thickness is formed at the bottom end of the via 62. The sealing layer 148 at portions of the via 62 and trench 60 will necessarily exceed the minimum necessary thickness for blocking the pores due to the shadow, diffusion and depletion effects noted in the Background section above. Optionally, the excess thickness can be reduced by a directional etch (e.g., reactive ion etch) that preferentially removes the overhanging portion of the sealing layer 148. In the case of an insulating sealing layer (not shown), this directional etch would at any rate be employed to remove insulating material from the bottom of the via and expose the underlying wire. The skilled artisan will recognize the sealing layer 148 as the result of a CVD or a PVD process, as the case may be, by the layer's characteristic profile, and particularly by the non-uniformity of this profile.

The minimum thickness for a CVD or PVD layer will typically represent between about 50% and 150% of the average pore size, more preferably between about 60% and 75% of the average pore size. PVD will generally require a smaller minimum thickness than CVD, although the required thickness in the field areas (over the insulators) will generally be greater for PVD for a given minimum thickness at the bottom of the via 62. It will be understood, however, that the actual minimum thickness for blocking the pores will depend upon the structure of the porous low k material (connectivity of the pores, density of the pores, range of deviation from average pore size, etc.) as well as the nature of the deposition. In view of the present disclosure, the skilled artisan can readily optimize deposition of the sealing layer 148 for a given process flow through routine experimentation.

In the illustrated embodiment, with an average pore size of about 4 nm, the sealing layer 148 is between about 2 nm and 6 nm in thickness at the bottom end of the via 62, more preferably between about 2.4 nm and 3 nm in thickness. The skilled artisan can readily determine the amount of deposition required, as measured in the field areas, to achieve the desired minimum thickness at the bottom of the via 62. Typical dual damascene structures and conventional (CVD, PVD) deposition dictate the field:minimum bottom thickness ratio is about 10:1. For less severe aspect ratios (e.g., single damascene or simple contact structures), the thickness ratio will be reduced significantly.

In addition to the illustrated embodiment, the sealing layer may also be formed using an alternating process. In this aspect of the invention, the pulses of reactants may be modified compared to the ALD processes described above. For example, the pulse of metal source gas can be longer than in conventional ALD. In addition, the purge time may be shortened. Both changes are designed to maximize the amount of metal source gas remaining in the pores of the insulating material following the first purge stage. An example of preferable reaction conditions for this method of deposition is provided in Table VI below, whereby residual metal source gas in the pores will react in a CVD-mode reaction with reducing agent from a subsequent phase. However, as will be recognized by one skilled in the art, any ALD method for forming metal nitride or metal layers may be used by modifying the duration of the stages in the cycle to provide for the deposition of a conductive layer that seals the porous low k material.

TABLE VI

| Phase | Carrier Flow (slm) | Reactant | Reactant Flow (sccm) | Temperature (° C.) | Pressure (Torr) | Time (sec) |
|---|---|---|---|---|---|---|
| metal | 600 | WF$_6$ | 50 | 400 | 10 | 0.5 |
| purge | 600 | — | — | 400 | 10 | 0.5 |
| reduce | 600 | TEB | 40 | 400 | 10 | 0.2 |
| purge | 600 | — | — | 400 | 10 | 0.8 |

The minimum thickness for an alternatingly deposited sealing layer will typically represent between about 50 and 150% of the average pore size, more preferably between 60 and 75% of the average poor size. As for PVD and conventional CVD, the actual minimum thickness will depend on the structure of the porous low k material. However, this embodiment provides for a higher conformality deposition of conductive material, thus eliminating the need for a directional etch and providing for the ability to seal a higher aspect structure.

Figure 11:
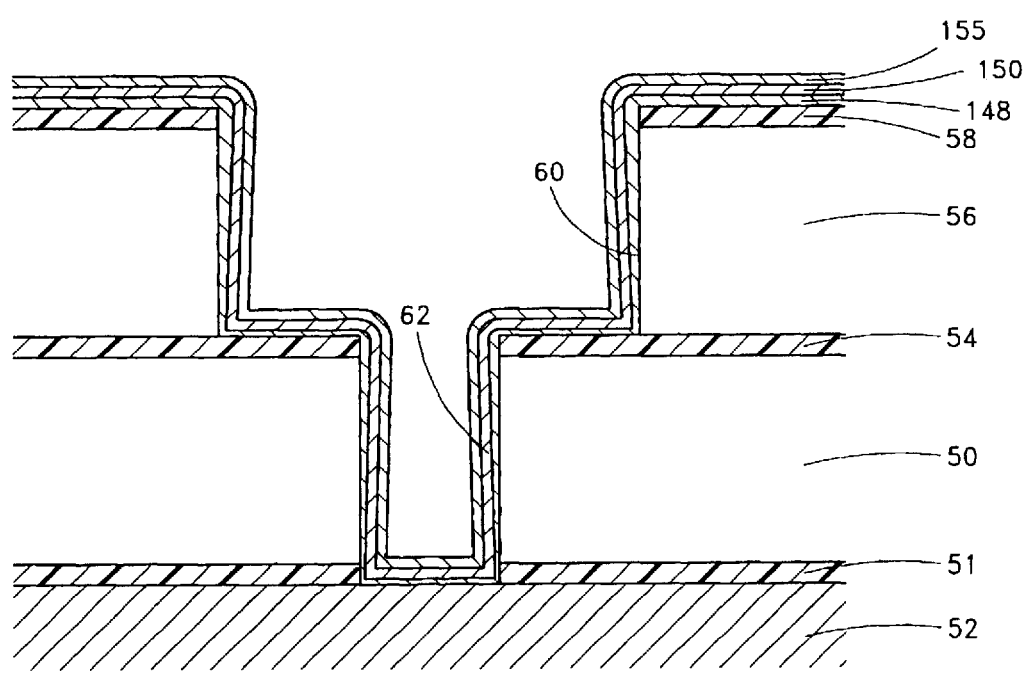

With reference to FIG. 11, if the sealing layer 148 is produced by conventional CVD or PVD, it is followed by a high step coverage lining layer 150, constructed in accordance with processes set forth above. As previously noted, depending upon the materials of the via and trench structure and the chemistries of the various deposition steps, the liner 150 can comprise an initial metal adhesion layer in addition to a metal nitride barrier layer. The lining layer 150 can comprise, for example, a bilayer of W/TiN, W/WN, Ti/TiN, Ti/WN, and any of a number of other combinations of adhesion film and barrier film. In the example of Table IV, the barrier layer is deposited directly over metal and insulating surfaces of the dual damascene structure, and can optionally comprise a WN/TiN bilayer. Preferably, at least one of the sublayers is formed by a highly conformal ALD process, in accordance with the methods disclosed above. The skilled artisan will recognize the liner 150 (or at least one sub-layer therein) as the result of a highly conformal ALD process by the layer's characteristic profile, and particularly by the uniformity of this profile.

The sealing layer 148, however, prevents this high conformal process from penetrating into the porous low k material. Most preferably, the underlying sealing layer 148 serves both a pore blocking or plugging function as well the adhesion function. This is the case when an alternating pulse method is used to produce the sealing layer 148. This method produces a high conformality conductive layer of either metal or metal nitride. In addition, it is possible to use any of these methods to create a metal/metal nitride bilayer that acts to seal the porous low k material. Accordingly, the ALD lining layer 150 preferably consists of a barrier layer alone.

In accordance with the barrier needs of dual damascene processing, and particularly in conjunction with fast-diffusing copper metal filler, the metal nitride barrier layer of the lining layer 150 is formed to about the minimal thickness necessary for adequate performance of its barrier function. Accordingly, the metal nitride layer lining the deep trench and via structure preferably has a thickness greater than about 20 Å. At the same time, high step coverage provided by the methods disclosed herein enable formation of the desired thickness uniformly over all surfaces of the trench 60 and contact via 62, including insulating sidewalls and a conductive via floor. Accordingly, the metal nitride liner within the via 62 is preferably no more than about 200 Å at any point of the structure and at any point during the process. More preferably, the metal nitrides of the preferred embodiments are deposited to a maximum thickness of between about 20 Å and 100 Å, and most preferably between about 40 Å and 80 Å.

Under the preferred conditions, material sufficient for a fraction of a monolayer is deposited per cycle, due to the physical size of the chemisorbed species preventing occupation of all available sites, particularly if the adsorbed species include organic ligands. In example of Table II, TiN grows at about 0.35 Å/cycle, such that preferably greater than about 50 cycles, more preferably between about 60 and 300 cycles, and most preferably between about 60 and 200 cycles are performed to produce an adequate TiN barrier layer to prevent copper diffusion.

As noted, the methods described herein enable extremely high step coverage (defined as a thickness of the liner on the bottom of the via as a ratio of the thickness of the liner on sidewalls of the via), even of the high aspect ratio trench and via structures of the preferred embodiments. The lining layer 150, and particularly ALD-formed film(s) within the liner 150, preferably exhibit step coverage greater than about 90%, more preferably greater than about 93%, and most preferably greater than about 97%.

With reference now to FIG. 11, a seed layer 155 is optionally formed over the lining layer 150. As noted above, such a seed layer 155 is desirable where the filling metal is to be deposited by electroplating and where the lining layer 150 demonstrates inadequate conductivity for effective electroplating. Under such conditions, the seed layer 155 can be deposited by PVD, more preferably by CVD and most preferably by ALD. In the illustrated embodiment, a "pure" copper is employed for the seed layer. In other arrangements, tungsten can be used as an electroplating seed layer. In still other arrangements, no seed layer is employed over the lining layer 150, such as in process flows preceding a non-electroplating fill procedure or where the barrier layer is adequately conductive (e.g., tungsten nitride), and enables direct nucleation of electroplated copper.

Figure 12:
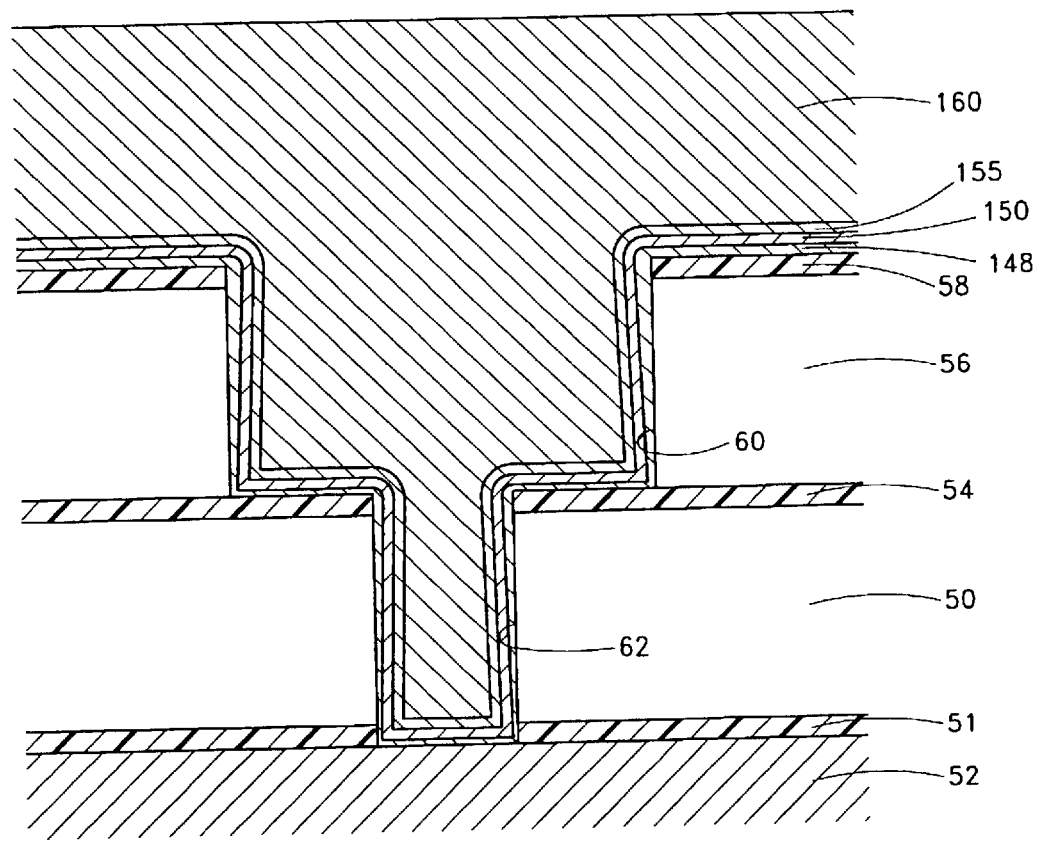

Referring now to FIG. 12, the lined damascene structure is then filled with a highly conductive metal 160. In the illustrated embodiment, where a seeding film is formed over the lining layer 150, the filler metal 160 preferably comprises electroplated copper. In other arrangements, metal such as aluminum can be deposited under high pressure and/or high temperatures to aid reflow into the deep trench and via structures, as will be appreciated by the skilled artisan. Effective barriers are also important in preventing spiking during the harsh conditions attending such deposition processes.

Figure 13:
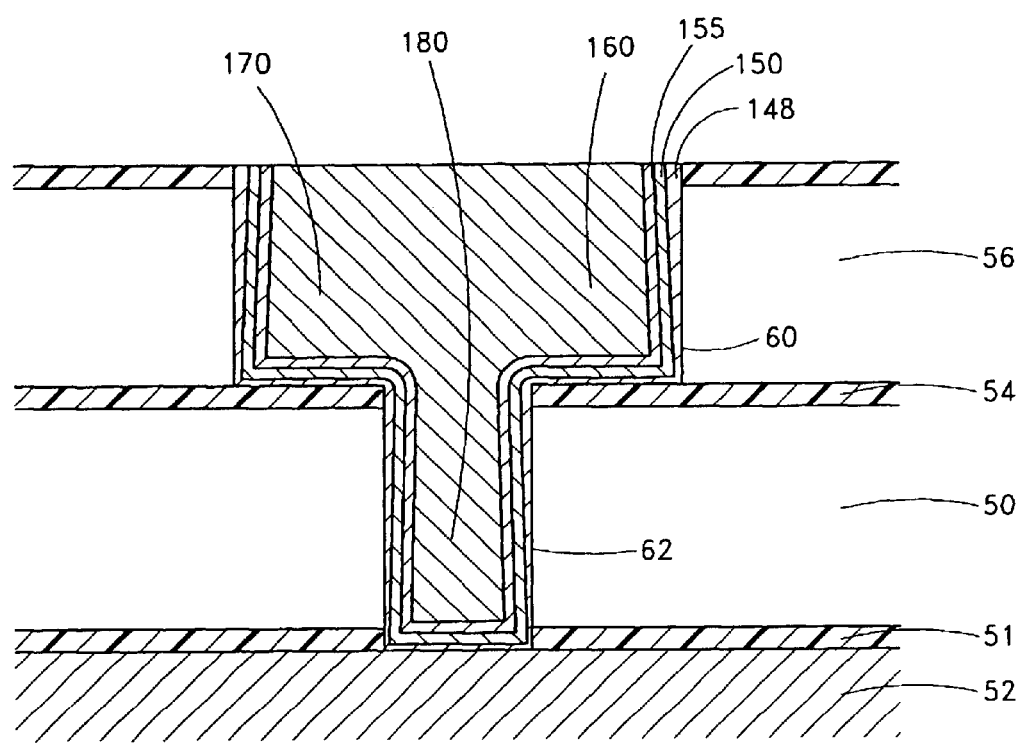

With reference now to FIG. 13, the structures are then planarized by chemical mechanical planarization (CMP) or other etch back process to leave isolated lines 170 within the trenches 60, having integral contacts 180 extending downwardly therefrom. Diffusion of the filler metal 160 is prevented both during the fill process as well as during any high temperature processing that follows.

Sealing Low K layers with Anisotropic Porosity

Figure 14:
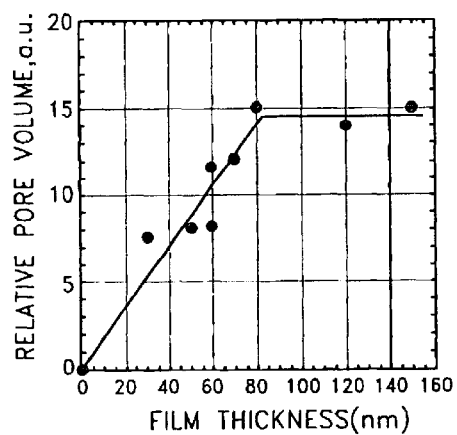
FIG. 14 is a graph showing relative pore volume at various film thicknesses for a conventional, isotropically porous low k material.

With reference now to FIGS. 14–19, it has been found that low k materials, depending upon the manner of formation, can have a non-uniform distribution and/or alignment of pores. FIG. 14 illustrates that, for a conventionally formed low k, porous material, overall pore volume measured by ellipsometric porosimetry increases with film thickness only up to a point, and thereafter saturates. The film represented in FIG. 15, however, remains linear for much greater film thicknesses, indicating that the top surface contains pore openings, and furthermore that the pores are relatively continuous from at least the top surface openings. Moreover, anisotropy was measured in the dielectric constant ("k-value") of the film analyzed in the experiment of FIG. 15. Whereas the film showed a measured k-value of 2.7 to 2.8 in the horizontal direction, the film showed a measured k-value of 2.8 to 2.9 in the vertical direction. Since porosity is known to have a strong influence on k-value, anisotropic k-value is an indication of anisotropic pore formation.

Figure 15:
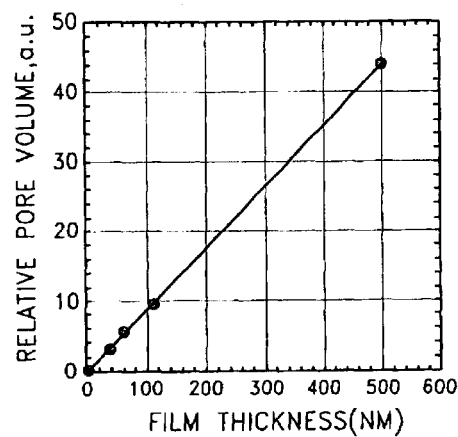
FIG. 15 is a graph showing relative pore volume at various film thicknesses for a particular low k material having vertically aligned pores.
Figure 16:
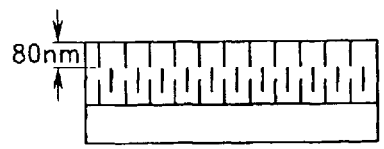
FIG. 16 is a schematic representation of the porous layer represented by the data in FIG. 14, having a random distribution of pores.
Figure 17:
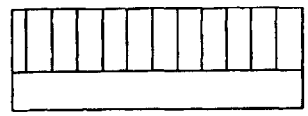
FIG. 17 is a schematic representation of the porous layer represented by the data in FIG. 15, having a bias toward vertically aligned pores.

FIGS. 16 and 17 are schematic representations of the films represented by the data to FIGS. 14 and 15, respectively. The conventionally formed film is illustrated as having a relatively random distribution and/or alignment of pores. The film of FIG. 17, on the other hand, is indicated to have a tendency to vertical alignment of the pores, and extension to the upper surfaces of the layer.

The material determined to demonstrate anisotropic pore structure, particularly vertical alignment, is the product of the AURORA® process, commercially available from ASM Japan K.K. of Tokyo, Japan. A description of the AURORA® process is given in U.S. Pat. No. 6,455,445, issued Sep. 24, 2002 to Matsuki and assigned to ASM Japan K.K., the disclosure of which is expressly incorporated herein by reference. As discussed therein, a siloxan polymer insulation film has a dielectric constant of 3.3 or lower and has —SiR$_2$O— repeating structural units. The siloxan polymer is formed by directly vaporizing a silicon-containing hydrocarbon compound expressed by the general formula Si$_\alpha$O$_\beta$C$_x$H$_y$ (where $\alpha$, $\beta$, x, and y are integers) and then introducing the vaporized compound to the reaction chamber of a plasma CVD apparatus. The residence time of the source gas is lengthened by reducing the total flow of the reaction gas, in such a way as to form a siloxan polymer film having a microporous structure and a low k-value. Of course, other processes may also produce anisotropic pore structures, and the methods described hereinbelow will also have application for layers produced by such other processes.

Figure 18:
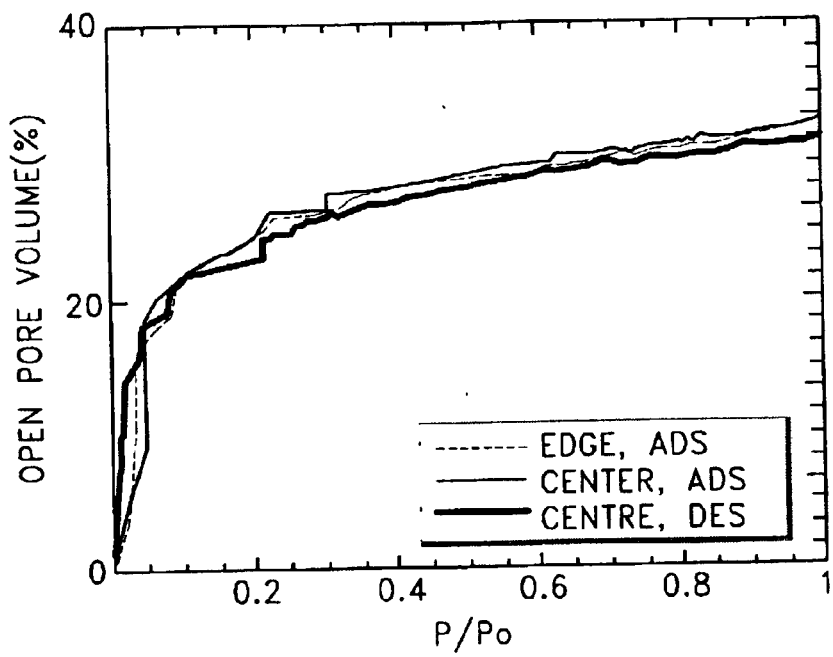
FIG. 18 is a graph showing the results of ellipsometric porosimetry of the low k material represented by the data in FIG. 15, illustrating open pore volume.
Figure 19:
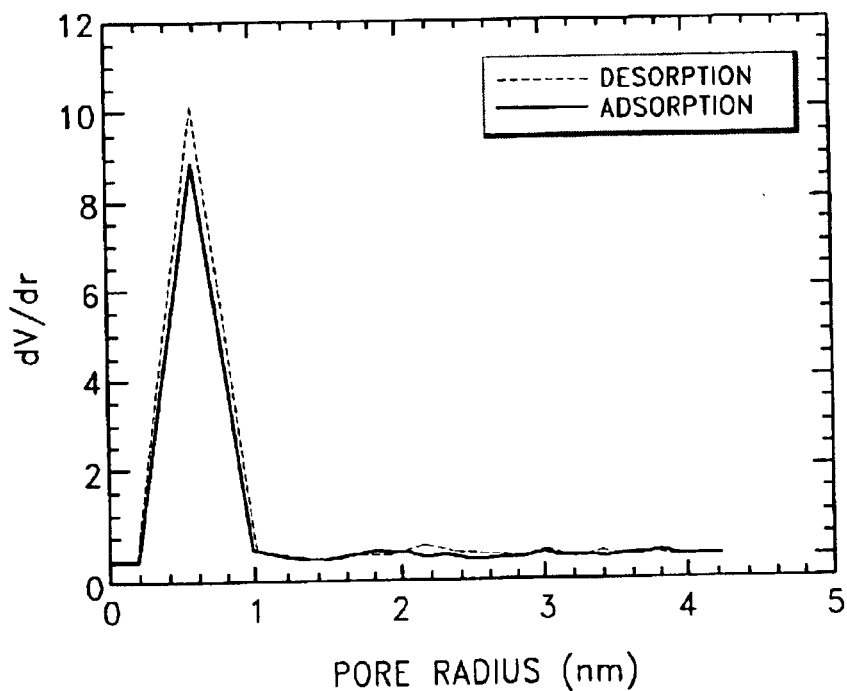
FIG. 19 is a graph showing the results of ellipsometric porosimetry, illustrating pore size distribution of the low k material represented by the data in FIG. 15.

FIGS. 18 and 19 indicate the results of ellipsometric porosimetry of the AURORA® low k material. FIG. 18 shows the open pore volume as a function of P/P$_0$, where P is the adsorptive pressure and P$_0$ is the equilibrium or condensation pressure of the adsorptive. From this data FIG. 19 is derived, showing pore size distribution (predominantly around 0.7 nm) of the low k material.

Figure 20:
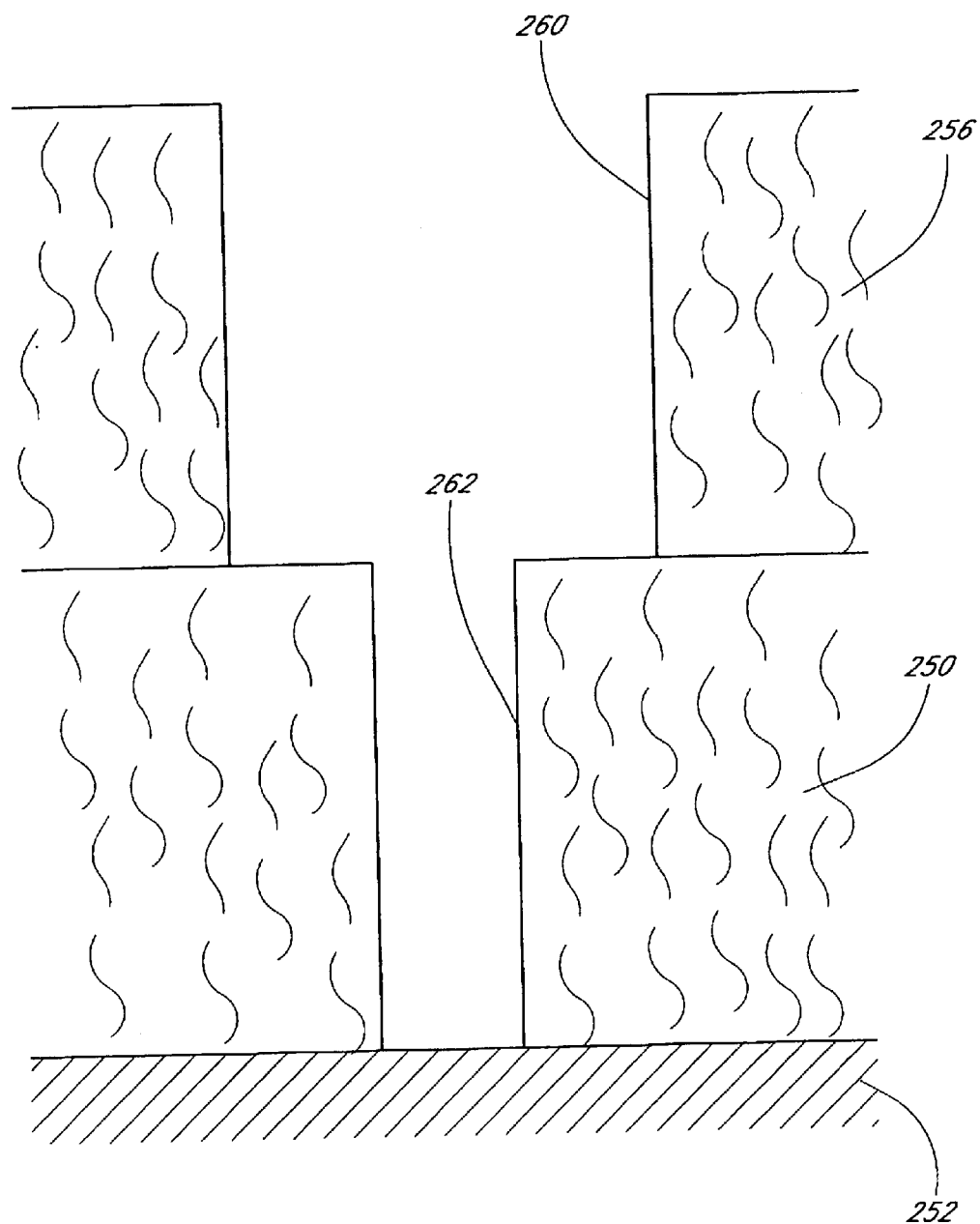
FIG. 20 is a schematic cross-section of a partially fabricated integrated circuit, including a dual damascene structure formed with the low k material represented by the data in FIG. 15.

FIG. 20 is a schematic cross-section of a partially fabricated integrated circuit, including a dual damascene structure formed with the low k material produced by the AURORA® process, described above. The structure is similar to that of FIG. 9*a*, but optional etch stop layers are omitted. The structure includes a lower conductive element 252, a lower insulating layer 250 and an upper insulating layer 256. A trench 260 is formed in the upper insulating layer 256 and a via 262 extends from the bottom of the trench 260. The dual damascene structure can also be formed from a single deposited insulating layer. Of course, the skilled artisan will readily appreciate that the processes taught herein are also applicable to single damascene processes, simple contact via processes, and also to any structure with high steps over which nonconformal deposition (see discussion of FIG. 22 below) is desired.

The low-k material of layers 250 and/or 256 of the illustrated embodiment contain anisotropic pore structures. Accordingly, it is desirable to block or seal such pores prior to further deposition, and in fact prior to many other types of processing that risk contaminants entering the pore network. On the other hand, since such pore openings are predominantly on the upper surfaces of the layers 250, 256, it is unnecessary and possibly undesirable to block or seal surfaces on the sidewalls of the trench 260 and via 262. Accordingly, it is preferred to preferentially block or seal the horizontal (in the illustrated orientation) surfaces of the low k layers 250, 256. By preferentially, it is meant that, overall, the horizontal surfaces are more affected by the blocking process than the vertical surfaces.

Figure 21:
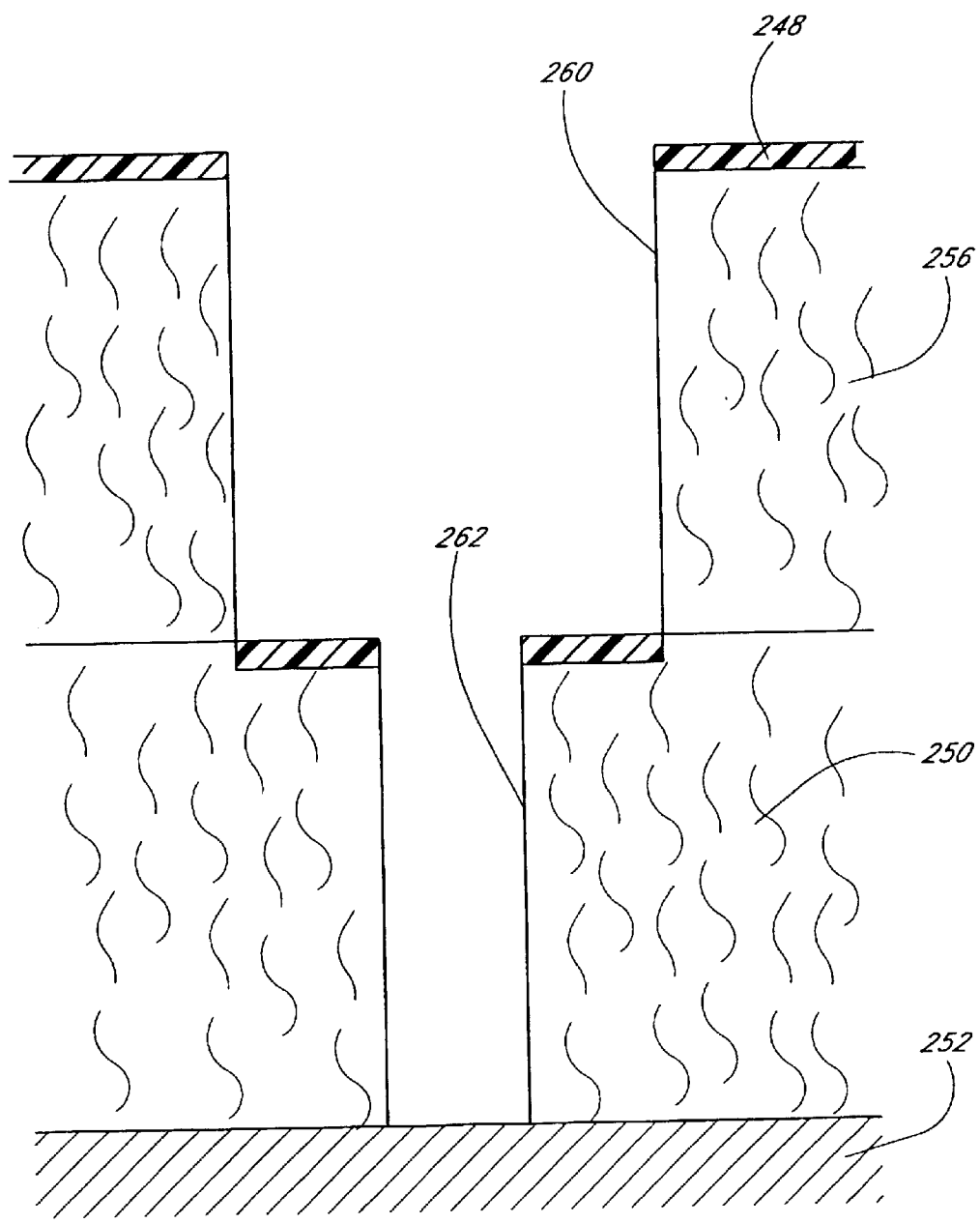
FIG. 21 illustrates the structure of FIG. 20 after exposure to targeted energy for sealing the upper surfaces of the low k material, in accordance with one embodiment of the present invention.

FIG. 21 illustrates the structure of FIG. 20 after preferential treatment in accordance with one embodiment of the invention. In the illustrated embodiment, upper portions of the structure are treated to reform and seal only upper portions of the insulating layers 250, 256. Accordingly, a deformed or sealing layer 248 is provided over the horizontal portions by collapse or melding of the uppermost layers. Preferably, the treatment comprises a targeted energy delivery to the upper or horizontal surfaces of the insulating layers 250, 256, causing melting of the pores a small depth into the upper surfaces and formation of the sealing layer 248. Rapid thermal annealing (RTA) of short enough duration can be employed with standard RTA heating sources, but preferably radiant energy is employed. Even more preferably, laser pulse annealing is employed, with power and pulse duration/separation selected to avoid penetration too deeply into the layers. Preferably, the selective anneal is arranged, through routine experimentation, to melt only 1–10 pore depths (0.7 nm to 7 nm) of the low k material from the upper surface, more preferably less than 3 pore depths on average.

Advantageously, radiant energy and particularly laser energy can be readily directed to anisotropically target the horizontal surfaces of the structure shown in FIG. 20. Furthermore, such treatment can be performed even through intervening layers, such as etch stop or barrier layers, to minimize subsequent diffusion through open pore paths. In accordance with the disclosure hereinabove, however, such sealing treatment by melting or other deformation preferably precedes highly conformal ALD processes. Since the deformed layer 248 seals the vertical pore openings in the layers 250, 256, the ALD process does not penetrate excessively into the pore network. Even if pores are exposed on the unaffected sidewalls of the trenches 260 or vias 262, such pores are typically not continuously connected deep into the insulating layers 250, 256 in the anisotropic pore structure of the preferred low k material and so do not significantly risk short circuiting or increased k-value.

Note that melting of via and sidewall coverage is not necessarily a disadvantage for the illustrated process. However, radiant or laser energy will naturally act in a directional manner and transmit more heat to the horizontal surfaces than vertical surfaces, and this manner of sealing is sufficient for layers with anisotropic pore structures. One advantage of the above-described sealing process is that it is very efficient and inexpensive relative to deposition techniques.

Figure 22:
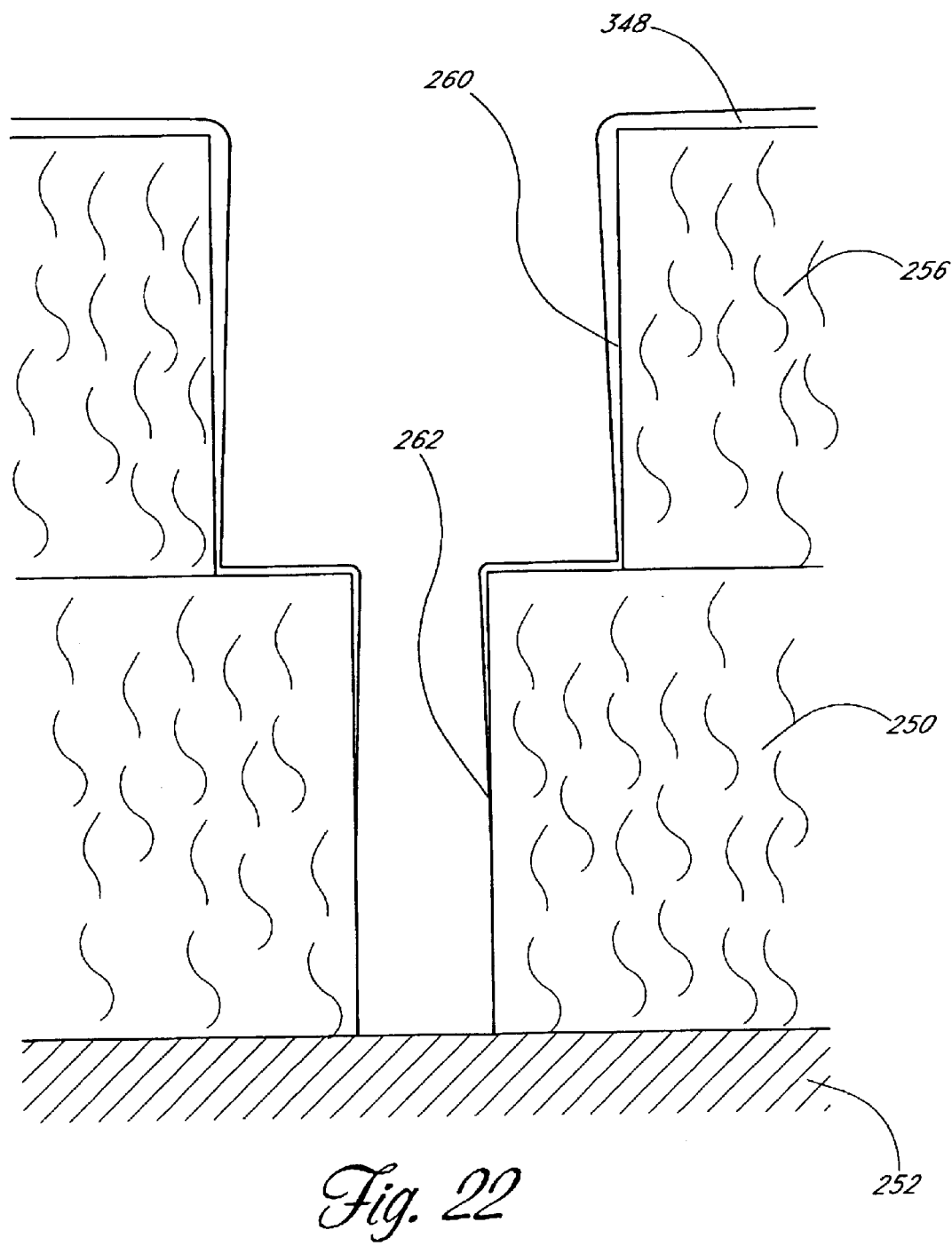
FIG. 22 illustrates the structure of FIG. 20 after low conformality deposition of a layer over the upper surfaces and only partially into the openings of the low k material, in accordance with another embodiment of the present invention.

With reference now to FIG. 22, the structure of FIG. 20 is shown after low conformality deposition of a layer in accordance with another embodiment of the present invention. As disclosed hereinabove with respect to the embodiment of FIGS. 10a and 10b, a sealing layer 348 is thus formed with low conformality such that it preferably penetrates no more than about 3 pore depths into the pore network of the insulating layers 250, 256. As will be appreciated from the foregoing descriptions, the deposition can comprise, e.g., CVD or ALD.

More preferably, however, the alternating deposition process discussed hereinabove, which is a modification of an ALD process, is employed due to the controlled conformality afforded by the process. As noted above, the anisotropic pore structure of the low k material of the present embodiment renders full sidewall coverage of the openings, namely the trenches 260 and vias 262 in the illustrated structure, unnecessary. Accordingly, the alternating deposition process can be tailored to avoid full coverage of the sidewalls, and consequently little if any deposition occurs on the via bottom over the lower conductive element 252. Advantageously, minimizing occupation of the trenches and vias maximizes the volume available for filler metal, such as copper. Furthermore, if an insulating material is selected for the sealing layer 348, no spacer or other selective etch is required to clear the via bottom prior to further lining/filling of the damascene structure.

As discussed above, the alternating deposition process operates partially in an ALD mode and partially in a CVD mode, such that an intermediate level of conformality is achieved. The comparisons presented herein are relative to an ALD process utilizing the same reactants or precursors, but optimized for self-saturating, self-limiting reactions over all sidewall and horizontal surfaces of the damascene structure. Such true ALD reactions can be assured by selecting extremely long (e.g., several minutes) reactant and purge durations; however, the skilled artisan will readily appreciate that such a true ALD process (referenced for comparative purposes in the present context) will be "optimized" by utilizing the minimum purge and pulse durations that will accomplish self-saturating and self-limiting reactions.

The low conformality, alternating deposition process can be designed by modifying the corresponding true ALD processes in a number of different manners, as set forth above. For example, reactant pulse separation times (preferably purging times) can be shortened to ensure that the reactants from one pulse remain when the next pulse arrives. Thus, CVD-type reactions occur with the arrival of the next reactant pulse, since the reactants are selected to be mutually reactive. Accordingly, the depletion effect accompanying CVD reactions allows deposition on the top surface and on sidewalls near the top of the openings (e.g., trenches and vias) but prevents significant deposition at deeper locations within the openings due to depletion of the reactants. By selecting the pulse separation, the share of CVD reactions in the deposition process can in principle be tuned from nil (perfect pulse separation) to 100% (no pulse separation between adjacent reactant pulses, or overlapping pulses of the two different reactants occur simultaneously). In this way the step coverage or conformality of the process can be tuned.

Alternatively, one or more of the reactant pulse durations in each cycle can be altered. In the example hereinabove, one or more reactant pulses were lengthened relative to the corresponding true ALD process, in order to ensure penetration of the reactant into the trenches, vias and pores in the sidewalls. In the present example, where full coverage of the trench/via sidewalls is not desired, reactant pulse durations can be shortened such that insufficient reactant is provided to reach into the deeper, more confined parts of the openings. Due to depletion effect, non-conformal deposition results.

Modelling experiments have found that the conformality of an alternating deposition process depends upon the size of openings in the structure of interest. With flat substrate or substrates with large openings (e.g., greater than 1 µm in width), it has been found that pulses are self-saturating with minimal pulse duration (e.g., after 0.07 s for one exemplary reactor). This is because, with flat substrates or substrates having large openings, transport is primarily convective. However, for smaller openings (e.g., less than 1 µm in width), transport is by Knudsen diffusion. In fact, the saturation depth has been found proportional to the width of the openings for small openings.

Figure 23:
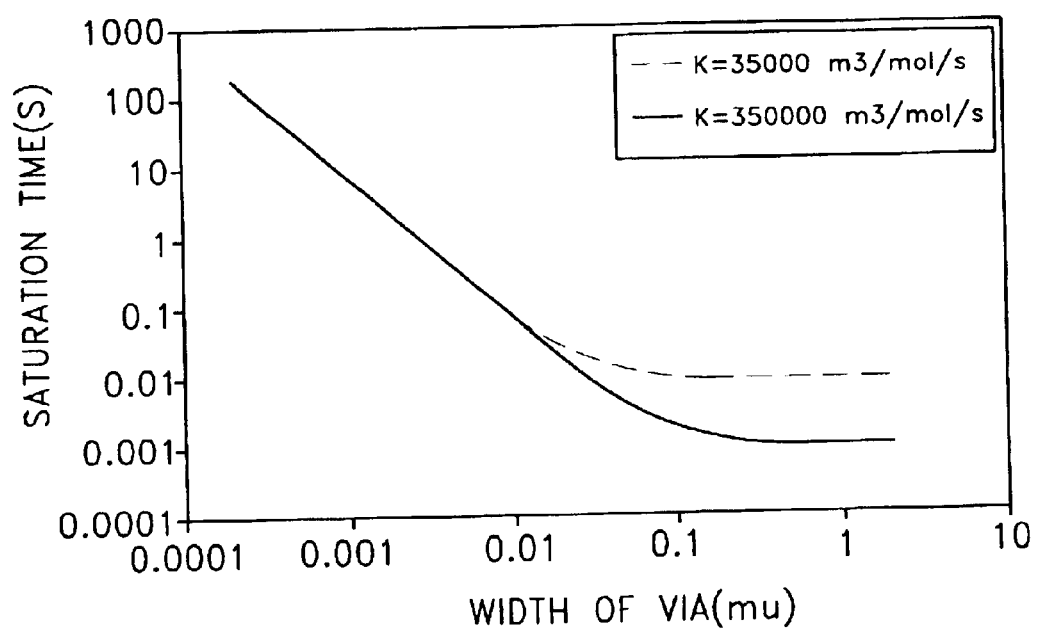
FIG. 23 is a graph illustrating saturation times for ALD-type reactant pulses over substrates having openings of various width.

FIG. 23 illustrates this proposition. Data is shown for two different adsorption coefficients, which is experimentally determined for a given reaction. As apparent from the graph, saturation times are independent of opening width when the openings are greater than about 1 µm. On the other hand, at less than 1 µm, and particularly less than 0.1 µm, the saturation times are strongly dependent upon the width of the openings.

Since state-of-the-art equipment has pulse resolution (e.g., about 0.03 s) on the same order of magnitude at the self-saturating period (about 0.07 s) for substrates with openings greater than 1 µm in width, modulation of pulse duration and/or separation cannot have a large effect on conformality. On the other hand, where features on the substrate have widths of less than 1 µm, and particularly less than 0.1 µm, conformality can be greatly affected by selection of pulse duration and/or separation. Greater saturation times enable better modulation of the conformality. Smaller openings thus permit selection of a pulse duration to prevent full saturation, and the reaction is subject to the depletion effect within the openings.

The above sealing processes are particularly useful to prevent filling openings by subsequent ALD processes, as discussed above. However, it will be appreciated that such sealing can also be useful to prevent subsequent diffusion from a variety of sources into the openings of a porous structure.

Although the foregoing invention has been described in terms of certain preferred embodiments, other embodiments will be apparent to those of ordinary skill in the art. For example, while processes are specifically provided particular lining materials, the skilled artisan will readily appreciate that ALD methods can be applied to lining damascene structures with other materials. Moreover, although illustrated in connection with a particular process flow and structure for dual damascene metallization, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method of fabricating an integrated circuit including a porous insulating layer having a plurality of trenches extending from an upper surface of the insulating layer, the method comprising:

blocking the pores on an exposed surface of the insulating layer, wherein blocking is performed preferentially upon upper surfaces of the insulating layer;

after blocking the pores, forming no more than about one monolayer of a first reactant species in a self-limited and self-saturating reaction; and reacting a second reactant species with the monolayer.

2. The method of claim 1, wherein blocking comprises melting an upper surface of the insulating layer.

3. The method of claim 2, wherein melting comprises laser annealing.

4. The method of claim 3, wherein melting comprises pulsing laser energy upon the horizontal surfaces of the insulating layer.

5. The method of claim 2, wherein melting comprises directing radiant energy upon horizontal surfaces of the insulating layer.

6. The method of claim 5, wherein radiant energy directly strikes a layer overlying the porous material.

7. The method of claim 1, wherein blocking comprises a deposition process having a reduced conformality compared to an atomic layer deposition selected to have self-saturating and self-limiting surface reactions.

8. The method of claim 7, wherein the deposition process is selected from the group consisting of CVD, PVD and an alternating deposition process that is less conformal than a self-saturating atomic layer deposition (ALD) process.

9. The method of claim 7, wherein the deposition process comprises an alternating deposition process, wherein reactant pulse durations and/or reactant pulse separations are selected to result in conformality between that of pure ALD and pure CVD.

10. A method of depositing a film over a structure having openings therein, comprising an alternating deposition process, wherein a plurality of sequential reactant pulses are separated from one another, the alternating process optimized to achieve a level of conformality between that of an atomic layer deposition (ALD) process and a chemical vapor deposition (CVD) process.

11. A method for controlling conformality of a deposited film on a semiconductor substrate, the method comprising:

providing the substrate with a plurality of openings at a surface thereof;

providing a sequence of at least two different, mutually reactive reactants in temporally separated and alternating reactant pulses;

selecting separations of the reactant pulses and durations of the reactant pulses to control the conformality of the film deposited in the openings in the surface of the semiconductor substrate, wherein the separations and durations are selected to achieve reduced conformality compared to a corresponding atomic layer deposition (ALD) process that is optimized to achieve maximum conformality with minimum cycle length for the substrate topography; and exposing the semiconductor substrate to the sequence of the reactant pulses with the selected separations and durations to deposit the film.

12. The method of claim 11, wherein a plurality of said openings have widths less than about 1 µm.

13. The method of claim 12, wherein a plurality of said openings have widths less than about 0.1 µm.

14. A semiconductor fabrication process, comprising:

providing a low k dielectric having an anisotropic pore structure and larger openings therein;

preferentially sealing an upper surface of the low k dielectric layer; and conducting an atomic layer deposition process (ALD) to deposit directly over the sealed upper surface wherein preferentially sealing comprises melting a portion of the k dielectric.

15. The method of claim 14, wherein 1–10 pore depths from the upper surface of the low k dielectric are melted.

16. The method of claim 14, wherein no more than about 3 pore depths from the upper surface of the low k dielectric layer are melted.

17. The method of claim 14, wherein melting comprises directing light energy on the upper surface.

18. The method of claim 17, wherein directing light energy comprises rapid thermal annealing with radiant heat lamps.

19. The method of claim 17, wherein directing light energy comprises pulsing laser energy.

20. A semiconductor fabrication process, comprising:
   providing a low k dielectric having an anisotropic pore structure and larger openings therein;
   preferentially sealing an upper surface of the low k dielectric layer; and
   conducting an atomic layer deposition process (ALD) to deposit directly over the sealed upper surface wherein preferentially sealing comprises depositing a sealing layer with reduced conformality compared to an atomic layer deposition (ALD) process in which self-saturating and self-limiting surface reactions take place within the openings and over the upper surface.

21. The process of claim 20, wherein depositing the sealing layer comprises a chemical vapor deposition process.

22. The process of claim 20, wherein depositing the sealing layer comprises an alternating deposition process wherein reactant pulse durations and/or separations are modified relative to the ALD process.

23. A method for deposition of a film on a semiconductor substrate, the method comprising:
   providing the substrate, the substrate having at a surface thereof different regions with different levels of accessibility;
   providing a sequence of at least two different, mutually reactive reactants in temporally separated and alternating reactant pulses;
   selecting separations of the reactant pulses and/or durations of the reactant pulses to achieve self-saturation and self-limiting atomic layer deposition (ALD) mode deposition on the most accessible regions on the substrate surface and depletion effects in less accessible regions on the substrate surface; and
   exposing the semiconductor substrate to the sequence of the reactant pulses with the selected temporal separations and durations to deposit the film.

24. The method of claim 23, wherein the regions comprise top surface reqions.

25. The method of claim 24, wherein the regions further comprise trench regions that are less accessible than the top surface regions.

26. The method of claim 24, wherein the regions comprise pore regions that are less accessible than the top surface regions.

27. The method of claim 23, wherein the separations and durations of the reactant pulses are selected such that significant deposition is prevented in the least accessible regions.

28. The method of claim 23, wherein the separations and durations of the reactant pulses are selected such that in the least accessible regions at the substrate surface the process is at least partially in CVD mode.

29. The method of claim 23, wherein the substrate comprises a porous material, exposed at the surface, and wherein deposition of the film in the porous material is limited to 3 pore depths.

* * * * *

UNITED STATES PATENT AND TRADEMARK OFFICE
CERTIFICATE OF CORRECTION

PATENT NO. : 6,759,325 B2
DATED : July 6, 2004
INVENTOR(S) : Raaijmakers et al.

It is certified that error appears in the above-identified patent and that said Letters Patent is hereby corrected as shown below:

<u>Title page,</u>
*Primary Examiner*, delete "Puch T. Dang" and insert -- Phuc T. Dang --.

<u>Column 1,</u>
Line 12, after "Titanium," insert -- Niobioum, Tantalum and --.
Line 15, delete "Water" and insert -- Wafer --.
Line 18, after "Jin et al." insert -- 257 --.
Line 19, after "Yoon et al." insert -- 438 --.
Line 37, delete "56-64" and insert -- 54-64 --.

<u>Column 2,</u>
Line 7, delete "vol. 142," before "No. 5".

<u>Column 6,</u>
Line 34, after "ILD" insert -- . --.

<u>Column 9,</u>
Line 3, delete "pores.," and insert -- pores. --.

<u>Column 35,</u>
Line 2, after "the" insert -- low --.

Signed and Sealed this

Eighteenth Day of April, 2006

JON W. DUDAS
*Director of the United States Patent and Trademark Office*